US012142466B2

(12) United States Patent
Genetti et al.

(10) Patent No.: US 12,142,466 B2
(45) Date of Patent: Nov. 12, 2024

(54) AUTOMATED TRANSFER OF EDGE RING REQUIRING ROTATIONAL ALIGNMENT

(71) Applicant: Lam Research Corporation, Fremont, CA (US)

(72) Inventors: Damon Tyrone Genetti, Livermore, CA (US); Roy Scott Powell, Boulder, CO (US); Darryl Angelo, Sunnyvale, CA (US); Hui Ling Han, Alameda, CA (US)

(73) Assignee: Lam Research Corporation, Fremont, CA (US)

( * ) Notice: Subject to any disclaimer, the term of this patent is extended or adjusted under 35 U.S.C. 154(b) by 365 days.

(21) Appl. No.: 17/613,024

(22) PCT Filed: May 8, 2020

(86) PCT No.: PCT/US2020/032056
§ 371 (c)(1),
(2) Date: Nov. 19, 2021

(87) PCT Pub. No.: WO2020/247146
PCT Pub. Date: Dec. 10, 2020

(65) Prior Publication Data

US 2022/0246408 A1 Aug. 4, 2022

Related U.S. Application Data

(60) Provisional application No. 62/858,274, filed on Jun. 6, 2019.

(51) Int. Cl.
*H01J 37/32* (2006.01)
*B65D 85/02* (2006.01)
(Continued)

(52) U.S. Cl.
CPC ........ *H01J 37/32807* (2013.01); *B65D 85/02* (2013.01); *B65G 1/04* (2013.01);
(Continued)

(58) Field of Classification Search
CPC ................ B65D 85/02; H01J 37/32908; H01J 37/32889; H01J 37/32623;
(Continued)

(56) References Cited

U.S. PATENT DOCUMENTS 6,368,450 B2 4/2002 Hayashi
7,682,455 B2 3/2010 Blattner et al.
(Continued)

OTHER PUBLICATIONS

ISR & Written Opinion PCT/US2020/032056, dated Aug. 21, 2020, 13 pages.

*Primary Examiner* — Glenn F Myers
(74) *Attorney, Agent, or Firm* — PENILLA IP, APC

(57) ABSTRACT

A ring storage station used for delivering a consumable part to a substrate processing system includes a housing that includes a base plate and a rotating plate disposed over the base plate. An end-effector opening is disposed at a first side of the housing and a service window opening is disposed at a second side of the housing. A set of finger support structures is connected to the rotating plate. Each finger support structure includes a support column and support fingers disposed thereon. At least two of the set of columns have support fingers with index pins to radially align consumable parts when disposed in the ring storage station. In one configuration, consumable parts may be designed to match the rotation angle engagement to ensure catching the angle alignment between ring storage and process module.

28 Claims, 13 Drawing Sheets

(51) Int. Cl.

| | |
|---|---|
| ***B65G 1/04*** | (2006.01) |
| ***H01L 21/673*** | (2006.01) |
| *B25J 11/00* | (2006.01) |
| *H01L 21/677* | (2006.01) |
| *H01L 21/687* | (2006.01) |

(52) U.S. Cl.
CPC .. *H01J 37/32642* (2013.01); *H01L 21/67346* (2013.01); *B25J 11/0095* (2013.01); *H01J 2237/334* (2013.01); *H01L 21/67742* (2013.01); *H01L 21/68707* (2013.01)

(58) Field of Classification Search
CPC ........... H01J 37/32642; H01J 37/32807; H01J 2237/334; H01L 21/67748; H01L 21/67769; H01L 21/67309; H01L 21/67303; H01L 21/67346; H01L 21/67201; H01L 21/67742; H01L 21/68707; B65G 1/04; B25J 11/0095
See application file for complete search history.

(56) References Cited

U.S. PATENT DOCUMENTS

| | | | | |
|---|---|---|---|---|
| 2009/0196714 | A1* | 8/2009 | Sylvestre .......... | H01L 21/67383 901/50 |
| 2015/0332950 | A1 | 11/2015 | Mazzocco et al. | |
| 2018/0068879 | A1* | 3/2018 | Wong ................ | H01L 21/67196 |

* cited by examiner

Inside of Ring storage station as seen through a EFEM port

Ring Position in Left Stacked Airlock (Side-by-Side same)

Adjustments in ring storage station 108b for VTM with 4 or 6 process module and airlocks
1134a
1134b
200
+θ°
+2°

1134a
1134b
200
0°

1134a
1134b
200
-θ°
-2°

Adjustments in ring storage station 108b for VTM with 5 process module and airlocks
1134a
1134b
200
+θ°
+2°

1134a
1134b
200
0°

1134a
1134b
200
-θ°
-2°

AUTOMATED TRANSFER OF EDGE RING REQUIRING ROTATIONAL ALIGNMENT

CLAIM OF PRIORITY

This application is a national stage filing of and claims priority, under 35 U.S.C. § 371, to PCT/US20/32056, filed on May 8, 2020, and titled "AUTOMATED TRANSFER OF EDGE RING REQUIRING ROTATIONAL ALIGNMENT", which claims the benefit of and priority, under 35 U.S.C. § 119(e), to Provisional Patent Application No. 62/858,274, filed on Jun. 6, 2019, and titled "AUTOMATED TRANSFER OF EDGE RING REQUIRING ROTATIONAL ALIGNMENT", both of which are incorporated by reference herein in their entirety.

BACKGROUND

1. Field of the Invention

The present embodiments relate to a cluster tool assembly used in manufacturing semiconductor wafers, and more particularly, to a ring storage station for pre-aligning a consumable part prior to delivering to a process module within the cluster tool assembly.

2. Description of the Related Art

A typical cluster tool assembly used in processing a semiconductor wafer includes a wafer storage box, such as a front opening unified pod (FOUP) that is used to deliver and store substrates, an equipment front end module (EFEM) that interfaces between the FOUP and a loadlock chamber, such as an airlock, and one or more process modules that are coupled to the loadlock chamber. Each process module is used to perform a specific manufacturing operation, such as a cleaning operation, a deposition, an etching operation, a rinsing operation, a drying operation, etc. The chemistries and/or processing conditions used to perform these operations can wear out some of the hardware components of the process module that are constantly exposed to the harsh conditions within the process module. These worn out hardware components need to be replaced periodically to ensure that the worn out hardware components do not cause the harsh chemicals or impurities generated in the process module to deposit on or wear out the underlying hardware components in the process module during semiconductor wafer processing. The hardware component maybe, for example, an edge ring that is disposed adjacent to a semiconductor wafer within a process module. During an etching operation, the edge ring may get worn out due to its continuous exposure to ion bombardment from plasma generated within the process module. The worn out edge ring needs to be replaced to ensure the run-to-run repeatability of the process and functionality of the underlying hardware components, such as a chuck, do not get compromised.

It is in this context that embodiments of the invention arise.

SUMMARY

Embodiments of the invention define a ring storage station that can be coupled to a substrate processing system and is designed to remove and replace worn out or used hardware components, such as an edge ring, of a process module disposed within the substrate processing system without a need to break vacuum (i.e., expose the substrate processing system to atmospheric condition). The substrate processing system is also referred to herein as a cluster tool assembly. A worn out or used hardware component that can be replaced is also referred to herein as a consumable part. The substrate processing system includes one or more process modules, with each process module configured to perform a semiconductor wafer processing operation. As the consumable part in a process module gets exposed to the chemicals and process conditions within, the consumable part gets worn out, used or consumed and needs to be replaced in a timely manner. The used consumable part may be replaced without opening the substrate processing system by replacing new parts that are stored in a ring storage station, which can be mounted to the substrate processing system. The ring storage station includes a part buffer with compartments that are used to store new consumable parts and/or used consumable parts that have been removed. The ring storage station and various modules and components of the substrate processing system including the process module(s), are coupled to a controller to enable the controller to coordinate access between the ring storage station and the process module(s) while the process module(s) is maintained in a vacuum state, so as to allow replacement of the consumable part in a controlled environment.

To provide easy access to the used or consumed consumable part, a process module of the substrate processing system is designed to include a lift pin mechanism. When engaged, the lift pin mechanism is configured to allow the consumable part to be moved from an installed position to a replacement position so that an end-effector of a robot available within the substrate processing system may be used to access and retrieve the raised consumable part from the process module. A replacement consumable part (i.e., new consumable part) is retrieved from the ring storage station and delivered to the process module and the lift pin mechanism is used to receive the new consumable part and lower it into position in the process module.

The design of the ring storage station and the substrate processing system is such that a need to open the substrate processing system to Atmospheric conditions in order to access the used consumable part, is eliminated. For example, the substrate processing system may include an equipment front end module (EFEM) maintained at Atmospheric condition. A first side of the EFEM may be coupled to one or more substrate storage stations (e.g., FOUPs) for transferring substrates into and out of the substrate processing system. In addition to substrate storage stations, one or more ring storage stations may be coupled to a second side or third side of the EFEM. A vacuum transfer module may be coupled to the third side of the EFEM through one or more loadlock chambers (also referred to herein as airlocks). One or more process modules may be coupled to the vacuum transfer module.

A robot of the EFEM may be used to transport the consumable part between the ring storage station and the airlock. In such implementations, the airlock acts as an interface by allowing the consumable part to be received from the EFEM while the airlock is maintained at Atmospheric condition. After receiving the consumable part, the airlock is pumped to vacuum, and a robot of the vacuum transfer module is used to move the consumable part to the process module. A robot of the vacuum transfer module is used to move the consumable part into the process module. A lift pin mechanism within the process module provides access to the consumable part by raising and lowering the consumable part, so that the replacement of the consumable part can be carried out by the robot of the vacuum transfer module in vacuum conditions.

The robot of the vacuum transfer module and the lift pin mechanism of the process module together allow precision delivery and retrieval of the consumable part thereby eliminating the risk of damage to any hardware components of the process modules during replacement of the consumable part. As the consumable part is being moved into the process module in a controlled manner, the time required to recondition the process module to bring it to an active operation state after replacement of the used consumable part, is substantially reduced.

In one embodiment, a ring storage station used for delivering a consumable part to a substrate processing system, is disclosed. The ring storage station includes a housing. The housing of the ring storage station includes a base plate and a rotating plate disposed over the base plate. An end-effector access opening is disposed at a first side of the housing. A service window opening is disposed on a second side of the housing. A set of finger support structures are connected to the rotating plate within the housing. Each of the set of finger support structures includes a support column and support fingers defined thereon. At least two of the set of finger support structures have the support fingers with index pins. The index pins are configured to provide rotational alignment for the consumable parts, when the consumable parts are disposed in the ring storage station.

In another implementation, a ring storage station used for delivering consumable parts to a substrate processing system is disclosed. The ring storage station includes a housing. The housing includes a base plate, an end-effector access opening disposed at a first side of the housing, a service window opening disposed on a second side of the housing, a set of finger support structures that include support fingers disposed on corresponding support columns. The set of finger support structures are connected to the base plate within the housing. At least one of the finger support structures is an adjustable finger support structure.

In yet another implementation, a ring storage station for delivering a consumable part to a substrate processing system is disclosed. The ring storage station includes a base plate, a first opening disposed on a first side of the ring storage station, a second opening disposed on a second side of the ring storage station, and a set of finger support structures defined on the base plate. Each of the finger support structures includes a support column and support fingers extending from the support column to a center of the ring storage station. At least two of the finger support structures have support fingers with index pins. The index pins are configured to provide rotational alignment for the consumable parts when the consumable parts are disposed in the ring storage station. A carrier plate housing is defined on the base plate. The carrier plate housing is configured to house a carrier plate that is used in moving the consumable part to and from the ring storage station.

In another implementation, can include loading of new and/or used consumable parts may be via a moveable FOUP at a front end to a fixed ring storage station which can be attached to the EFEM. This embodiment would allow automatic consumable part loading and unloading.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings.

DESCRIPTION

Figure 1:
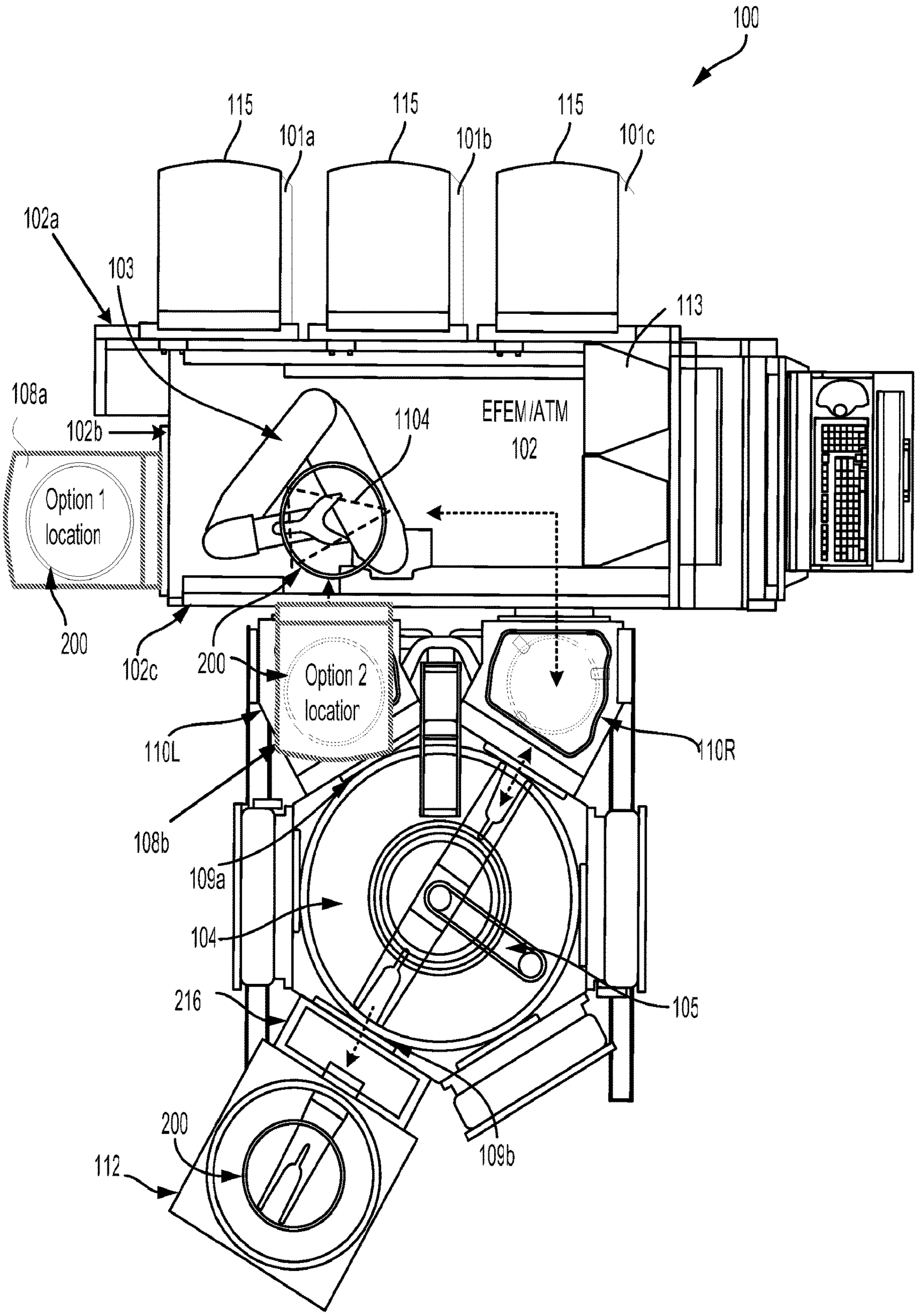
FIG. 1 illustrates a simplified block diagram of a substrate processing system identifying alternate locations where a ring storage station can be coupled, in one embodiment of the invention.

Embodiments of the disclosure define a ring storage station coupled to a substrate processing system (i.e., a substrate processing system) that is used to process a semiconductor substrate. The substrate processing system includes a plurality of modules, such as a equipment front end module (EFEM), a vacuum transport module (VTM), one or more loadlock chambers disposed between the EFEM and the VTM, and one or more process modules that are used to perform process operations on a semiconductor substrate. The process modules and the one or more loadlock chambers are distributed symmetrically around the VTM. Some of the process operations that can be performed in the different process modules include a cleaning operation, a deposition, an etching operation, a rinsing operation, a drying operation, etc. A wafer storage station is mounted to a load port defined on a first side of the EFEM and is used to provide the substrates for processing. A ring storage station is mounted to a side of the EFEM and is used to deliver a consumable part (e.g., edge rings) to the substrate processing system for replacement within a process module. Dedicated robots within the substrate processing system are used to retrieve a used consumable part from the process module and replace with a new consumable part retrieved from the ring storage station. The consumable part is replaced within a process module in a controlled manner so as to avoid any risk of contamination to components of the process module or the substrate processing system.

Traditional design of a substrate processing system required the substrate processing system to be opened in order to access and replace the consumable part, such as the edge ring, within a process module. Opening of the substrate processing system required taking the substrate processing system offline and purging the substrate processing system to atmospheric condition to allow access to the process modules. Once the substrate processing system is opened, a trained technician would manually remove and replace the consumable part from a process module. Upon replacement of the consumable part, the substrate processing system had to be conditioned so that the semiconductor substrate can be processed. Since the semiconductor substrates are valuable products, extreme care has to be taken when conditioning the substrate processing system. The conditioning would require cleaning the substrate processing system, pumping the substrate processing system to vacuum, conditioning the substrate processing system and qualifying the substrate processing system using test runs. Each of these steps requires considerable time and effort. In addition to the time required at every step to condition the substrate processing system, additional delays may be experienced when problems are encountered at one or more of the steps during the conditioning of the substrate processing system.

Some of the problems commonly encountered during the conditioning of the substrate processing system may include misalignment of the consumable part during replacement, damage to the new consumable part when replacing a used consumable part, damage to other hardware components in the process module during retrieval or replacement of the consumable part, substrate processing system not achieving vacuum after pumping, substrate processing system not achieving process performance, etc. Based on the severity of each problem, additional time and effort may have to be expended, further contributing to delay of bringing the substrate processing system online, directly impacting the profit margin for a manufacturer. The consumable part is designed to allow pre-alignment within the ring storage station so that the consumable part, when delivered to the process module, aligns with lift pins of the lift pin mechanism employed in the process module. The design of the consumable part and the design of the ring storage station allow the robots of the substrate processing system and a lift pin mechanism employed within the process module to reliably replace the consumable part without damaging the consumable part or any components of the process module or the substrate processing system. Grooves are provided on an underside surface of the consumable part and are used to align with index pins provided on finger supports within the ring storage station, when the consumable part is being loaded into the ring storage station. A base plate structure of the ring storage station is used to provide rotational alignment of the finger support structures of the ring storage station to the grooves of the edge ring.

The grooves provided on the underside surface of the consumable part define the “anti-walk” feature, as these grooves, when engaged by the lift pins, assist in keeping the consumable part in place, thereby preventing the consumable part from “walking” or sliding. The pre-alignment of the consumable part using the groove feature and the use of robot ensure that the edge rings can be delivered with precise alignment so that replacement of the edge ring can be carried out in a controlled environment in a timely manner Timely replacement of the consumable parts in a controlled environment reduces the amount of time required to condition the substrate processing system, thereby increasing quality and yield of semiconductor components defined on the semiconductor substrate.

The ring storage station is mounted to a side of an equipment front end module (EFEM) of the substrate processing system, in one implementation. A robot of the EFEM is used along with one or more robots of the substrate processing system to access and replace the consumable part from a process module. In other implementations, the ring storage station is also designed to mount to different modules of the substrate processing system to enable replacement of the consumable part without requiring the substrate processing system to be opened to atmospheric conditions to access the consumable part.

For example, the ring storage station may be mounted directly to a vacuum transfer module (VTM) within the substrate processing system. The mounting of the ring storage station ensures that the symmetry of the VTM is maintained. A robot of the VTM that is used to move a semiconductor substrate into and out of process modules may be used to retrieve and replace a consumable part disposed in the one or more process modules.

In another example, the ring storage station may be mounted directly to a process module of the substrate processing system in which a consumable part needs to be replaced. In such implementations, the ring storage station may include a robot that is used to retrieve and replace the consumable part from the process module.

Mounting the ring storage station to the substrate processing system and accessing the consumable part through the ring storage station saves considerable amount of time and effort required for maintaining the substrate processing system. The risk of damage to the consumable part, process module and/or the substrate processing system is minimized by using the robot(s) available within the substrate processing system and the lift pin mechanism available within the process module for replacing the consumable part. The risk of contamination is minimized as the replacement of the consumable part is performed in a controlled environment, thereby avoiding exposure of the inside of the substrate processing system to outside atmosphere. The lift pin mechanism of the process module enables a more precise alignment of the consumable part in the process module. Consequently, time required to condition the substrate processing system is greatly reduced. Timely replacement of the consumable parts increases quality and yield of semiconductor components defined in the semiconductor wafer.

With the general understanding of the inventive implementations, details of specific implementations will be discussed with reference to the various drawings.

FIG. 1 illustrates a simplified schematic diagram of a sample substrate processing system 100 used to process a semiconductor substrate to which a ring storage station 108 can be coupled, in one example implementation. The substrate processing system 100 includes a plurality of modules to allow the semiconductor substrate to be processed in a controlled environment. For example, the substrate processing system 100 shown in the figure includes an equipment front end module (EFEM) 102, a common vacuum transfer module (VTM) 104 and one or more facets defined around the VTM 104 for integrating with one or more process modules (e.g., 112). The facets are defined to provide symmetry to the VTM 104. One or more load ports 101*a*-101*c* are defined on a first side 102*a* of the EFEM 102 on which a substrate storage station (e.g., front opening unified pods or FOUPs) 115 is received. The EFEM 102 is operated under ambient (i.e., atmospheric) condition, thereby allowing a semiconductor substrate to be brought in from a substrate storage station 115 into the integrated substrate processing system 100 for processing, and for returning the semiconductor substrate, after processing.

The VTM 104 and the process modules are operated under vacuum so as to minimize exposure of the semiconductor substrate surface to atmospheric air as the semiconductor substrate is moved from one process module to another during processing. Since, the VTM 104 is operating under vacuum and the EFEM 102 is operating at Atmospheric condition, one or more loadlock chambers 110 are interfaced between the EFEM 102 and the VTM 104 to provide a controlled interface for transferring the semiconductor substrate from the substrate storage station 115 through the EFEM 102 to the VTM 104. In FIG. 1, a right loadlock chamber 110R and a left loadlock chamber 110L are shown to be disposed between the EFEM 102 and the VTM 104.

In one implementation, a ring storage station 108*a* is coupled to a second side 102*b* of the EFEM 102 (i.e., option 1 location shown in FIG. 1) and the one or more loadlock chambers 110 (e.g., 110L and 110R) are coupled to the third side 102*c*, which is opposite to the first side 101*a* of the EFEM 102. The ring storage station 108*a* includes a part buffer with a plurality of compartments or slots stacked in horizontal orientation, to hold consumable parts, such as the edge rings. In one implementation, the ring storage station 108*a* coupled to the second side of the EFEM 102 may be disposed on top of a wafer storage station 115' (not shown) that is coupled to the second side of the EFEM 102.

Figure 1A:
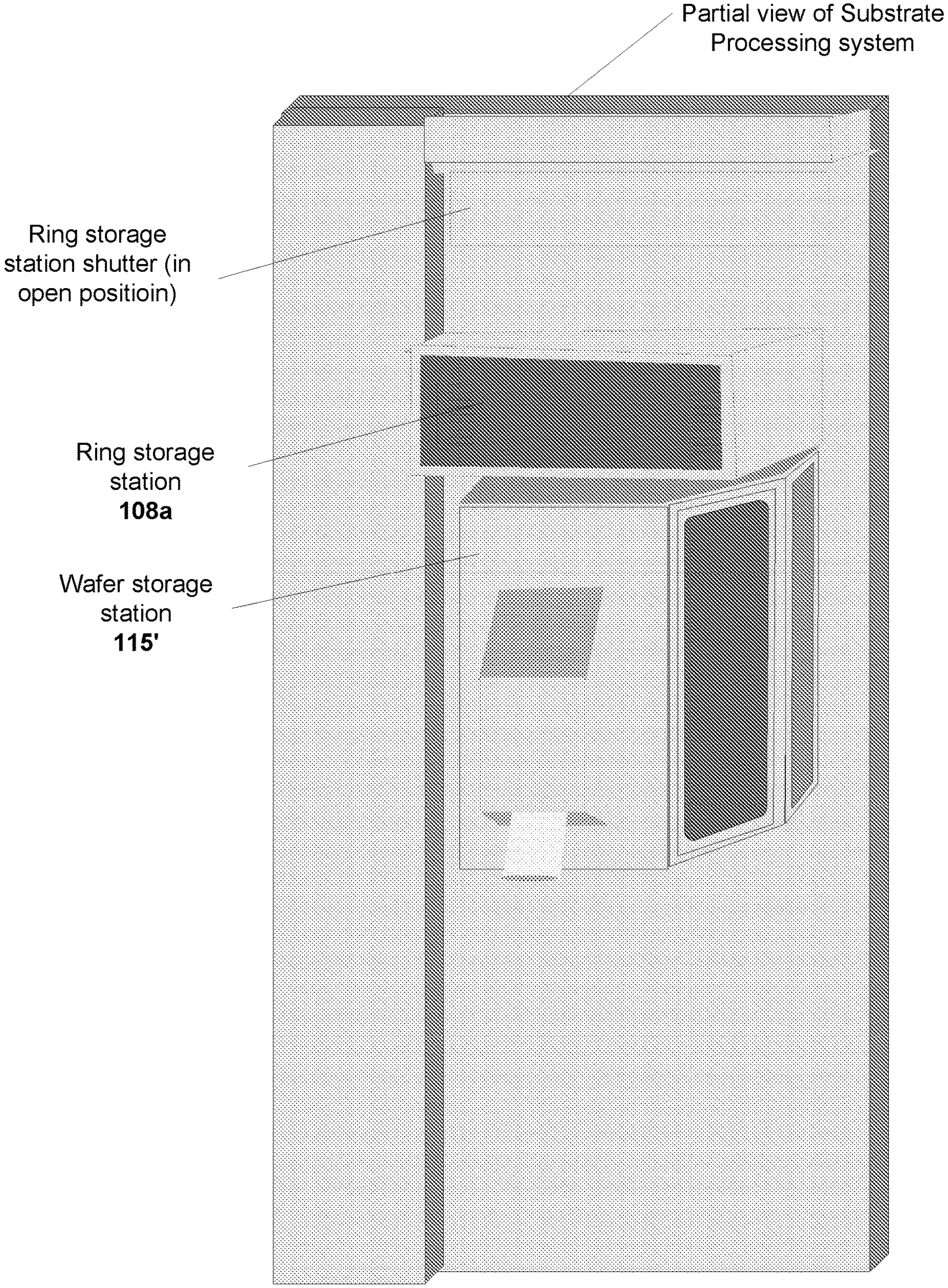
FIG. 1A illustrates a side view of a substrate processing system with the ring storage station disposed on a second side of an equipment front end module of the substrate processing system above a substrate storage station, in one implementation.

FIG. 1A illustrates one such implementation wherein the ring storage station 108*a* is coupled to the EFEM 102 above the wafer storage station 115' defined on the second side of the EFEM 102.

Referring back to FIG. 1, in an alternate implementation, the ring storage station 108*b* may be defined on the third side where the one or more loadlock chambers 110 are coupled (i.e., option 2 location shown in FIG. 1). In this implementation, the ring storage station 108*b* may be disposed above a loadlock chamber 110 (either 110L or 110R). It should be noted that the side and the location where the ring storage station are coupled to the EFEM are provided as examples and that other sides and locations may also be considered as long as the design of the EFEM permits such coupling.

The EFEM 102 includes a robot 103 to move the semiconductor substrate from the substrate storage station 115 to the loadlock chamber 110. The robot 103 is a dry robot as the EFEM 102 is maintained at atmospheric condition. The same robot 103 of the EFEM 102 used to move the substrate may also be used to move the consumable part from the ring storage station (either 108*a* or 108*b*) to the loadlock chamber 110. The EFEM 102 also includes one or more alignment chambers 113 to align the substrate retrieved from the substrate storage station 115 prior to delivering the substrate to a process module (e.g., 112) through the loadlock chamber 110.

In one implementation, the movement of the consumable part between the ring storage station 108 and the VTM 104 may be limited to go through one loadlock chamber 110 in order to control induced rotation. In the example embodiment illustrated in FIG. 1, the right loadlock chamber 110R is used to move the edge ring 200 between the ring storage station 108 (i.e., ring storage station 108*a* defined on the second side above the substrate storage station 115' or the ring storage station 108*b* defined on the third side above the left loadlock chamber 110L or from both the ring storage stations 108*a*, 108*b*) and the VTM 104 via interface 109*a* for delivering to a process module 112 via interface 109*b*, for example. The decision of which airlock 110 (i.e., either right airlock 110R or left airlock 110L) to use may be dependent on the design of the VTM 102 used in the substrate processing system, the angle at which the edge ring is deposited into each of the process module, the airlock 110, and the ring storage station. The design of the VTM 102 may depend on a number of process modules that are integrated with the VTM 102, in addition to the airlocks (110R, 110L).

A separate robot 105 provided within the VTM 104 is used to retrieve the semiconductor substrate from the loadlock chamber 110 and transfer the semiconductor substrate into and out of a process module (e.g., 112). Due to its location, the loadlock chamber, in some embodiments, is also referred to as an "interfacing chamber" or an "airlock". The airlock(s) 110 may be selectively maintained in ambient condition or vacuum. For example, when the substrate is being moved between the substrate storage station 115 and the airlock 110 via the EFEM 102, the airlock 110 is maintained in ambient condition and when the wafer is being moved between the airlock 110 and the VTM 104, the airlock 110 is maintained in vacuum. Similar process may be used by the robot 103 of the EFEM 102 when moving a consumable part between the ring storage station 108*a* or 108*b* and the airlock 110, and by the robot 105 of the VTM 104 when transporting the consumable part between the airlock 110 and the process module 112.

In alternate implementation, the left airlock 110L may be used to move the edge ring 200 between the ring storage station 108 and the VTM 104. The ring storage station 108, in this alternate implementation may be defined on the second side of the EFEM 102 either on its own or on top of the substrate storage station 115', or on the third side of the EFEM 102 above the right airlock 110R (i.e., the airlock 110 that is in the opposite side of the airlock 110 used in moving the edge ring). In a different implementation, the ring storage station 108*b* may be disposed on the third side of the EFEM 102 above the left airlock 110L, for example, and the robot 103 of the EFEM 102 may be used to move the edge ring 200 from the ring storage station and deposit into the left airlock 110L disposed below the ring storage station 108*b*. Alternately, the ring storage station 108*b* may be disposed above the right airlock 110R and the robot 103 of the EFEM 102 may be used to move the edge ring 200 from the ring storage station 108*b* to the right airlock 110R below the ring storage station 108*b*. The airlock (i.e., either right or left airlock) 110 selected for moving the consumable part may depend on the design of the VTM and the angle at which the consumable part is being deposited into the airlock by the robot of the VTM 104 and the angle at which the consumable part is deposited by the robot of the EFEM 102 into the ring storage station. The design of the VTM 104 may depend on the number of facets defined in the VTM 104 for integrating the process modules. In the implementation illustrated in FIG. 1, the VTM 104 is designed to include 6 facets with four facets used to receive four process modules and the fifth and sixth facets used to receive the airlocks 110. Other designs of the VTM 104 that can be used in the substrate processing system may include 5, or 6 or greater than 6 or less than 4 facets for connecting with the process modules in addition to the two facets for coupling the airlocks. The ring storage station is configured to receive and store consumable parts, such as edge rings that are used in the process module.

In the process module, the edge rings are disposed adjacent to an outer edge of the substrate, when the substrate is received within the process module. The edge rings are also referred to as "top rings" as they are disposed in the process module so that a top surface of the edge ring is co-planar with a top surface of the substrate.

The facets of the VTM 104 are defined such that the process modules 112-120 and the airlocks 110 are symmetrically disposed around the VTM 104. In some embodiments, the process modules 112-120 distributed symmetrically around the VTM 104 are used to perform distinct process operations. Some of the process operations that can be carried out using the process modules 112-120 include etch operation, rinsing, cleaning, drying operation, plasma operation, deposition operation, plating operation, etc. By way of example, process module 112 may be used to perform a deposition operation, process module 114 may be used to perform a cleaning operation, process module 116 may be used to perform a second deposition operation, process module 118 may be used to perform an etch or removal operation, and so on. The VTM 104 with the controlled environment allows the semiconductor substrate to be transferred into and out of the process modules 112-120 without risk of contamination and the robot within the VTM 104 assists in transferring the semiconductor substrate into and out of the various process modules 112-120 that are integrated with the VTM 104.

The replacement of the consumable part is also conducted in a controlled environment within integrated substrate processing system minimizing exposure of the surface of the substrate to ambient atmosphere. This controlled processing environment minimizes the amount of time required for conditioning the substrate processing system after replacement of the consumable part, so as to begin processing the substrates, while ensuring the processing environment does not get contaminated during replacement of the consumable part.

An isolation valve or a shutter may be provided to interface between the ring storage station and the EFEM 102, when the ring storage station is coupled to the second side of the EFEM or the third side where the airlock is defined. The isolation valve/shutter is used to isolate the ring storage station. The isolation of the ring storage station may be useful during loading of the consumable parts onto the ring storage station. Additional isolation valve(s) or gate 216 may be provided to interface between the process module and the VTM 104. Operation of the isolation valves, shutter (s) and gate(s) (if any) are coordinated to provide controlled access to the process module and the ring storage station.

The ring storage station is a removable, modular unit that is designed to be temporarily mounted to the EFEM 102 of the substrate processing system to complete the required operation of replacing the consumable part, such as the edge ring. After the replacement of the consumable part at the process module, the ring storage station may be dismounted. The dismounted ring storage station is retracted and stored till the consumable part needs to be replaced in the same process module 112 or a different process module 114-120. Alternately, the ring storage station may be permanently mounted to a side of the EFEM and the shutter or the isolation valve separating the ring storage station and the EFEM may be activated to isolate the ring storage station from the rest of the substrate processing system.

The ring storage station includes a part buffer with a plurality of compartments for receiving and holding the consumable parts. Separate set of compartments may be defined in the ring storage station to store used consumable parts that are retrieved from a process module, and new consumable parts that are to be delivered to the process module. In one embodiment, an opening in the ring storage station and the size of the isolation valve, shutter defined at one or each of the modules (e.g., EFEM, airlocks, or process module) are designed to allow movement of the consumable part between the ring storage station and the process module.

Due to proximity of the consumable part to the semiconductor substrate in the process module and its continuous exposure to the harsh process conditions used during processing of the semiconductor substrate, the consumable part needs to be closely monitored and replaced timely. The consumable part used in the process module is a replaceable component. In addition to being a replaceable component, the consumable part (i.e., edge ring) is also tunable on the height with the lift pins up or down to adjust the plasma at the wafer edge.

For example, in an etch process module, an edge ring is disposed adjacent to the semiconductor substrate mounted on a chuck assembly to extend the process region of the semiconductor substrate. During the etching operation, the edge ring is exposed to the ion bombardment from the plasma that is used to form features on a surface of the semiconductor substrate. For instance, during the etching operation, ions from the plasma hit the semiconductor substrate surface at an angle that is perpendicular to a plasma sheath formed in a process region defined above the semiconductor substrate, received in the process module. Over a course of time, as a result of continuous exposure to the plasma, a top surface of the top ring gets worn out. When layers of the edge ring wear away due to ion bombardment, the edge of the semiconductor substrate is exposed causing the plasma sheath to roll along a contour of the semiconductor substrate edge. Consequently, the ions hitting the semiconductor substrate surface follow the contour of the plasma sheath thereby causing tilt features to be formed toward the edge of the semiconductor substrate surface. These tilt features would affect the overall yield of the semiconductor components formed on the semiconductor substrate.

To improve the yield, reduce edge exclusion region, and to avoid compromising the functionality of any underlying components, the edge ring is tuned by moving the edge ring up so as to make the top surface of the edge ring coplanar with the top surface of the substrate, when the substrate is received for processing. An amount of tuning of the edge ring is based on a thickness of the edge ring and the amount of wear out experienced at the top surface of the edge ring. When tuning the height of the edge ring has exceeded a threshold level, the edge ring may be replaced. A lift pin mechanism (not shown) within the process module 118 provides access to the consumable part in the process module so that the edge ring can be retrieved and replaced.

After removing the used edge ring from the process module, the robot 103 of the EFEM 102 is used to transport a new edge ring from the ring storage station to the airlock 110 and the dedicated robot 105 of the VTM 104 is used to transport the new edge ring from the airlock 110 to the process module. Although some of the implementations are discussed herein with reference to the ring storage station being coupled to specific side(s) and/or location on the EFEM 102, the teachings can be extended to other implementations where the ring storage station is coupled to different sides and/or locations of the EFEM 102. Further, the ring storage station 108*a* or 108*b* used to store the used edge ring may be different from the ring storage station used to store the new edge ring.

Access to the ring storage station and the process module can be selectively enabled by coordinating the operation of the different isolation valves and/or gates, shutter(s) disposed between the different modules and between the EFEM and the ring storage station. For example, in one implementation, isolation valves and/or gates disposed between the EFEM and the ring storage station and between the VTM 104 and the one or more of the process modules 112-120, the robots of the EFEM 102 and the VTM 104, and the lift pin mechanism of the one or more process modules may all be operatively connected to a controller 122. The controller 122 may be part of a computer or may be communicatively connected to a computer 124 that can be used to provide input to coordinate operation of the specific ones of the isolation valves and/or gates, the airlocks, the robots 103, 105 of the EFEM and the VTM, respectively, and the lift pin mechanism of the process module during retrieval and replacement of the consumable part.

The isolation valve or shutter defined between the ring storage station and the EFEM 102 may be used to isolate the ring storage station so that consumable parts may be loaded onto the ring storage station without affecting the processing of the substrate within the substrate processing system. Similarly, a second isolation valve defined between the VTM 104 of the substrate processing system 100 and a process module (e.g., 112) where the consumable part needs to be replaced, is used to isolate the process module 112 from the rest of the substrate processing system 100 so that the replacement of the consumable part within the process module can be easily carried out without affecting operation of other process modules of the substrate processing system 100. Providing the second isolation valve allows taking only the specific process module (112) off-line instead of the whole substrate processing system 100, while the remainder of the process modules (114-120) within the substrate processing system 100 may be allowed to continue processing the semiconductor substrate. Further, as only a specific process module (e.g., 112) is brought off-line for replacing the consumable part(s), it would take considerably less time to restore the process module (112) and the substrate processing system 100 to a fully operational state. As a result, time taken for conditioning and qualifying operation of the substrate processing system 100 is much shorter.

In some implementations, when the consumable part, such as the edge ring, needs to be replaced in more than one process module, the operation of the robots and the corresponding isolation valves within the substrate processing system 100 may be coordinated so that the consumable part may be replaced in the different process modules in a sequential manner. In such embodiments, the time taken for replacing the consumable parts in a plurality of modules may be much shorter as the ring storage station and the process module(s) are selectively isolated, thereby allowing the remaining modules to continue with the substrate processing operations.

In one implementation, the compartments in the part buffer of the ring storage station are used to store new and used edge rings together. Alternately, in a second implementation, the part buffer of the ring storage station may include two distinct holding areas with a first holding area configured for holding the used edge ring and a second holding area for holding the new edge ring. In this implementation, the area storing the new edge ring may be separated from the area storing the used edge ring using a separator plate. Based on how the ring storage stations are configured, appropriate ring storage stations may be coupled to the EFEM when the edge ring needs to be replaced in a process module of the substrate processing system.

Further, the ring storage station is used to pre-align the edge ring prior to the robot 103 of the EFEM 102 moving the edge ring 200 to the airlock 110. The pre-aligning of the edge ring is done so that when the edge ring 200 is delivered to the process module, the alignment of the edge ring is within a "capture range" of the lift pins of the lift pin mechanism employed with the process module 112. To assist in the pre-alignment of the edge ring 200, the edge ring 200 may include grooves defined on the underside surface.

Figure 2A:
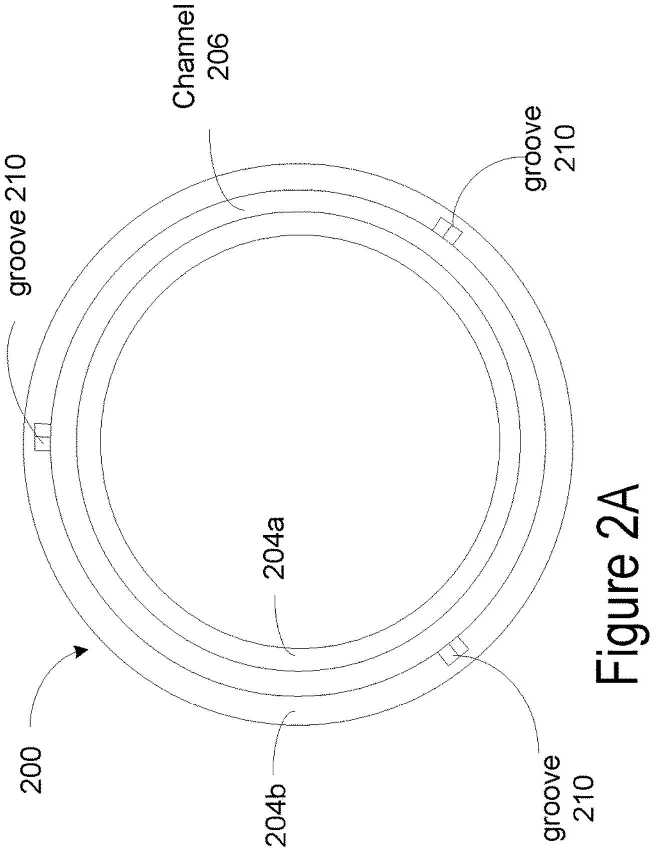
FIG. 2A illustrates a simplified block diagram of a consumable part, such as an edge ring, that is being used in one or more process modules of the substrate processing system and needs replacement, in one implementation.

FIGS. 2A-2D illustrate geometry of different embodiments of the edge ring 200 that is used in the process module of the substrate processing system that needs to be replaced, in some implementations. The edge ring illustrated in FIGS. 2A-2D is a tunable and replaceable edge ring. FIG. 2A illustrates a top view of a bottom surface of a first embodiment of the edge ring 200. The first embodiment of the edge ring 200 illustrated in FIG. 2A includes a bottom inner surface 204*a*, a bottom outer surface 204*b* and a channel 206 defined between the bottom inner surface 204*a* and the bottom outer surface 204*b*. A set of three grooves 210 are defined on the bottom outer surface 204*b* such that the grooves are located equidistant (e.g., disposed at 120°) from one another and are disposed adjacent to the channel 206. An open end of each groove 210 opens into the channel 206 and the tip of the groove is defined proximal to a circumference of the edge ring.

Figure 2B:
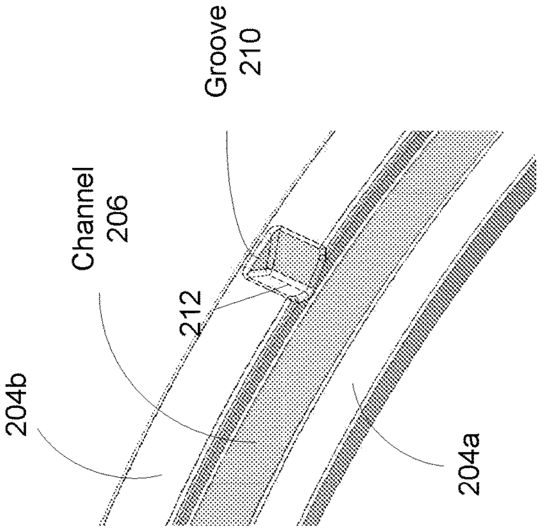
FIG. 2B illustrates an expanded view of a portion of a bottom side of the consumable part showing details of a groove defined thereon, wherein the groove is used for pre-aligning the consumable part prior to delivering to a process module, in one implementation.

FIG. 2B illustrates a magnified view of a portion of a bottom surface of the first embodiment of the edge ring 200 showing the different components of the groove 210 formed thereon. The groove 210 defined on the bottom outer surface 204*b* opens into the channel 206. The groove 210 defines a pin contact position 212 where the lift pin of the process module contacts the edge ring, when the lift pins are engaged. The design of the groove 210 may also include different shapes, for example semi-spherical shape, cylindrical shape (e.g., elongate direction directing towards paper or three directions, e.g., as shown in 2A).

Figure 2C:
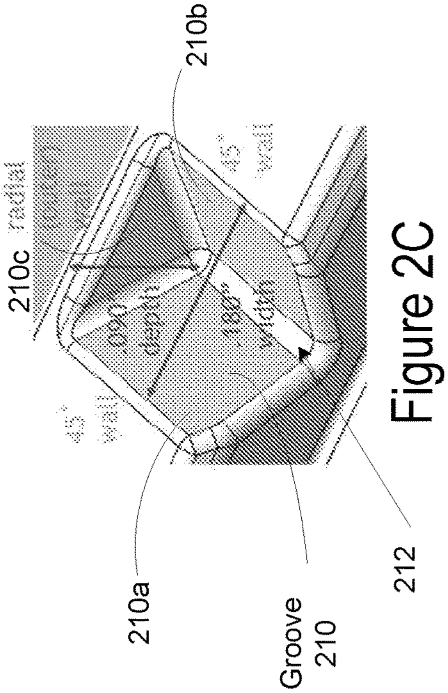
FIG. 2C illustrates an expanded view of the groove defined on the bottom side of the consumable part, in one implementation.

FIG. 2C illustrates an expanded view of the groove formed on the bottom surface of the first embodiment of the edge ring 200. The groove 210 in this embodiment is shown to have inclined sidewalls 210*a*, 210*b* that meet at a tip defining the pin contact position 212, and a radial outer wall 210*c* is defined adjacent to the bottom outer surface 204*b*. In one implementation, the sidewalls 210*a*, 210*b* are each inclined at an angle that is between about 30° and about 60°. In alternate implementation, the sidewalls 210*a*, 210*b* are each inclined at about 45° angle. The angle at which the sidewalls 210*a*, 210*b* are inclined is provided as an example and should not be considered restrictive. The tip defining the pin contact position 212 where the sidewalls 210*a*, 210*b* meet is shown to be sharp in this implementation. In one implementation, a depth of the groove is between about 0.075" to about 0.1". In another implementation, the depth of the groove is about 0.09". A width of the groove at the open end is between about 0.15" to about 0.20", in one implementation. In an alternate implementation, the width of the groove 210 is about 0.180". The grooves define an anti-walking feature as they prevent the edge ring from sliding out or "walking", when engaged by the lift pin. Again, the dimensions provided here are simply to illustrate one example, and adjustments to such dimensions and associated shapes can be made so long as the anti-walk function is provided.

Figure 2D:
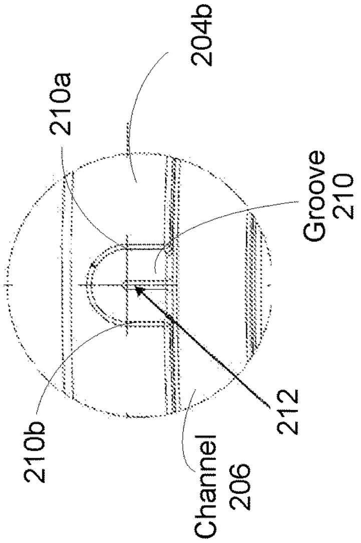
FIG. 2D illustrates an expanded view of the groove defined on the bottom side of the consumable part, in an alternate implementation.

FIG. 2D illustrates an expanded view of a portion of a bottom surface of a second embodiment of the edge ring 200 used in one or more process modules of the substrate processing system, in one implementation. In this implementation, a tip of the groove where the sidewalls meet and where the lift pin contacts the groove (i.e., pin contact position 212), is rounded. Although the illustration in FIG. 2D shows vertical sidewalls 210*a*, 210*b* for the groove, the sidewalls 210*a*, 210*b* of the groove 210 are inclined to allow the lift pin to slide to the bottom of the groove and rest at the pin contact position 212 (not shown). As in the first embodiment, the groove 210 in the second embodiment of the edge ring is formed on the bottom outer surface 204*b* and is adjacent to and opens into the channel 206. The geometry of the different components of the edge ring is given just as an example and should not be considered limiting. Other ranges and measurements of the various components of the edge ring can also be envisioned. The various implementations of the edge ring define pin contact positions defined on the bottom surface that are used to pre-align the edge ring within the ring storage station prior to delivering the pre-aligned edge ring to the process module, so as to align with the lift pins of a lift pin mechanism used in the process module.

FIGS. 3A-3I illustrate the various components of an example ring storage station that is used to supply the consumable part to the substrate processing system, in one implementation. The various components are used in receiving, pre-aligning and storing the edge rings so that when the edge rings are delivered to the process modules the edge rings correctly align with the lift pins. Different embodiments of the ring storage station 108 are used based on which side of the EFEM 102 the ring storage station is coupled.

Figure 3A:
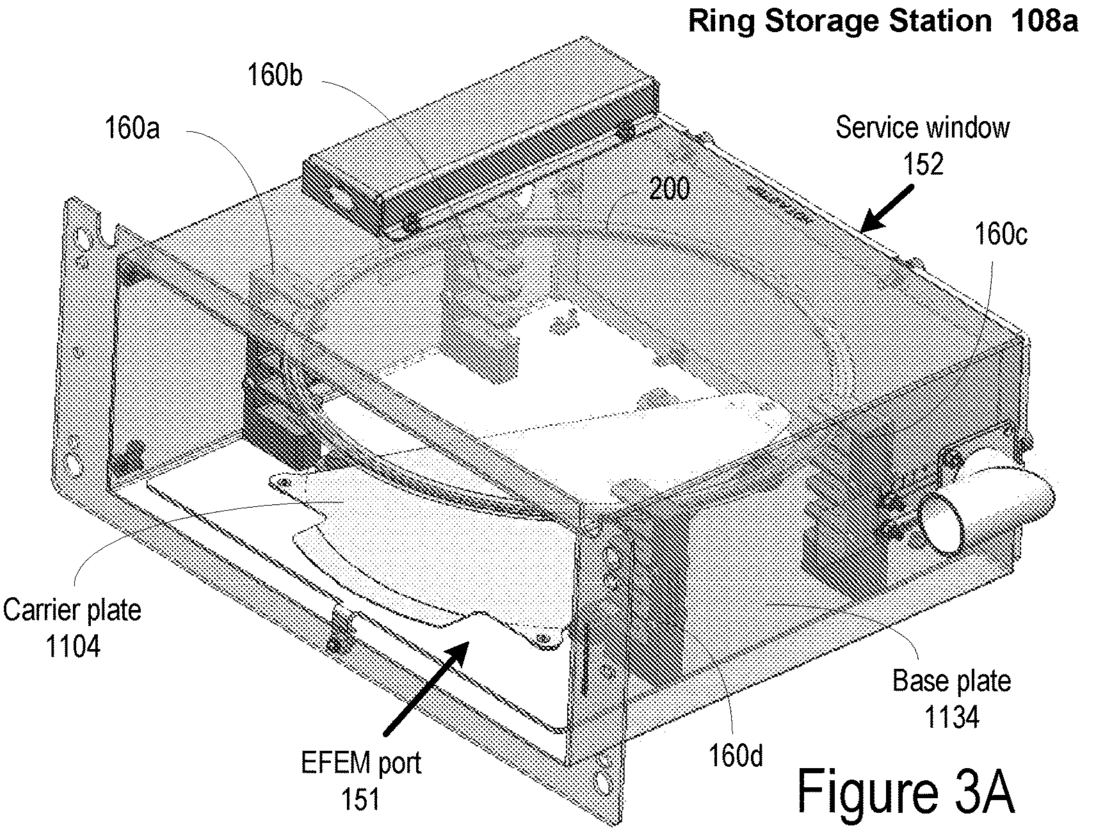
FIG. 3A illustrates a perspective view of a ring storage station that is configured to be coupled to a second side of an equipment front end module (EFEM) while one or more substrate storage stations are coupled to a first side of the EFEM and one or more airlocks coupled to a third side of the EFEM, in one implementation.

FIG. 3A illustrates a first embodiment of the ring storage station 108*a* that is coupled to a second side of the EFEM 102, in one implementation. In the first embodiment, the ring storage station 108*a* includes a base plate structure with a front side, a back side, a first lateral side and a second lateral side that are parallel to one another. The first lateral side extends between the first ends of the front side and the back side and the second lateral side extends between the second ends of the front side and the back side. The base plate structure forms the base of the ring storage station 108*a*. A top plate is defined opposite to the base plate structure. The ring storage station 108*a* includes a first opening or a window 151 defined on the front side. A first shutter is defined on the front side to provide access to the ring storage station through the first opening 151 in order to deposit used edge ring or retrieve new edge ring. The front side is configured to be coupled to the second side of the EFEM 102 such that the opening 151 provides a robot of the EFEM 102 access to the edge rings stored inside the ring storage station 108*a*. The front side 151 coupled to the EFEM is also termed the EFEM port. A second window 152 is defined on a back sidewall formed along the back side of the base plate structure, wherein the back sidewall extends vertically from the base plate structure to the top plate. A second shutter is defined on the back sidewall to provide access to the ring storage station during loading or unloading of the edge rings to or from the ring storage station 108*a*. A first sidewall is defined along the first lateral side of the base plate structure and extends vertically from the base plate structure to the top plate. A second sidewall is defined on the second lateral side of the base plate structure and extends vertically from the base plate structure to the top plate.

A plurality of finger support structures 160*a*-160*d* is defined on the base plate structure 1134. Each finger support structure includes a support column and a plurality of finger supports defined along an inside length of the corresponding support column, in a horizontal orientation. Each finger support of each finger support column includes a first end that is attached to the support column and a second end that extends toward an inner region of the ring support station 108*a*. In the implementation illustrated in FIG. 3A, the plurality of finger support structures includes a first pair of finger support structure 160*a*, 160*b*, defined along the first lateral side of the base plate structure such that the first finger support structure 160*a* of the first pair is proximal to the front side and the second finger support structure 160*b* of the first pair is proximal to the back side of the base plate structure. Similarly, a second pair of finger support structures 160*c*, 160*d* is defined along the second lateral side of the base plate structure such that the third finger support structure 160*c* of the second pair is proximal to the back side of the base plate structure and the fourth finger support structure 160*d* of the second pair is proximal to the front side of the base plate structure. The support columns 160*a*-160*d* are parallel to one another. A size of the support fingers in the first and the second pair of finger support structures are equal.

Each support finger on the first and the fourth finger support structures 160*a*, 160*d* include an index pin (not shown) defined on a top surface and proximal to the second end. In one implementation, the index pin is a raised pin with a defined tip. The index pins are used to engage with corresponding grooves defined on the underside surface of the edge ring 200, when the edge ring 200 is received in the ring storage station. When the grooves of an edge ring correctly align with the index pins on corresponding fingers defined on the first and the fourth finger support structures 160*a*, 160*d*, the edge ring is lowered into position on the top surface of the finger support such that the corresponding index pins engage the edge ring. When the edge ring received in the ring storage station does not align properly to the index pins, either the edge ring is rotated or a portion of the base plate structure is rotated along a horizontal axis to enable the grooves of the edge ring to properly align with the corresponding index pins on the corresponding finger supports. An amount of rotation of the base plate structure may be driven through calibration using test runs. A height of the index pins are defined so as to provide sufficient clearance for the edge ring to be moved into the ring storage station and be supported on the respective support fingers.

In one implementation, the support columns are made of aluminum material. In other implementations, the support columns are made of anodized aluminum or other corrosion resistant material. In some implementation, the support fingers are made of aluminum or other light weight material. The support fingers defined on the second and the third support columns may include support pads (not shown) to provide reliable contact surface for the edge ring, when received. The support pads, in some implementations may be made of carbon filled PolyEtherEtherKetone (PEEK) material so as to provide a non-scratch support surface for the edge ring. The materials used for the support columns, the support fingers and the support pads are provided as examples and should not be considered restrictive. Other materials may be used so long as the other materials maintain the functionality of the different components of the finger support structures.

The ring storage station also includes a housing to receive a carrier plate 1104. In one implementation, the housing includes a set of carrier supports 1137 defined on a top surface of the base plate structure and is configured to support a carrier plate 1104 received in the housing. The carrier supports 1137 are positioned on the base plate structure in accordance to a shape of the carrier plate 1104 and are designed to hold the carrier plate in place, when received at the carrier supports. For example, when the carrier plate 1104 is triangular in shape, the carrier supports 1137 are positioned along a triangular outline of the carrier plate 1104. In some implementations, the carrier supports are made of Carbon filled PEEK material. In other embodiments, the carrier supports 1137 may be made of other material selected to prevent corrosion and other wear while providing support to the ring carrier 1104. Alternately, the carrier supports 1137 may be made of metals and coated with corrosion resistive material, such as epoxy, Teflon, etc. The carrier supports are defined on the base plate structure such that the carrier plate is separated from the base plate structure. A height of the carrier supports will determine the height from which the finger supports are defined along a length of the support columns of the finger support structures. The carrier plate 1104 is used for supporting the edge ring when the edge ring is to be moved into and out of the ring storage station 108*a*. The top plate is configured to enclose the plurality of finger support structures.

Figure 3B:
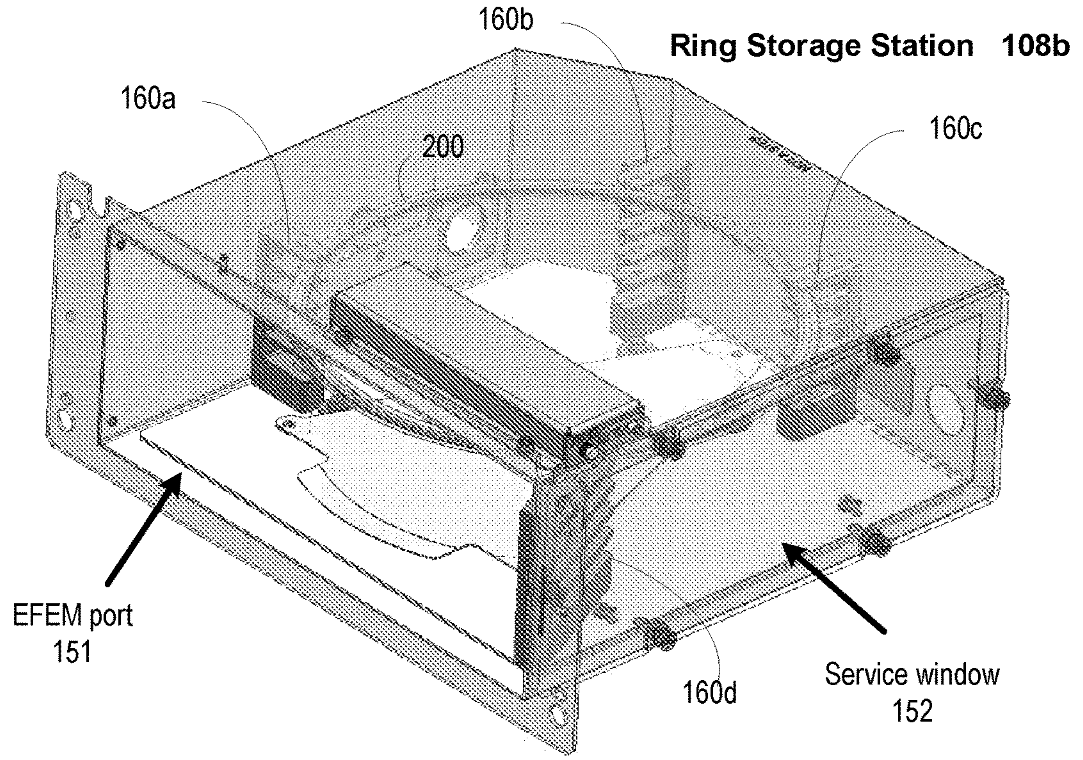
FIG. 3B illustrates a perspective view of a ring storage station that is configured to be coupled to a third side of an equipment front end module (EFEM) on top of an airlock, wherein the third side is opposite to a first side on which one or more substrate storage stations are coupled to a first side of the EFEM, in an alternate implementation.

FIG. 3B illustrates a simple block diagram of a second embodiment of the ring storage station 108*b* that is used to couple to the EFEM 102 on the third side above an airlock 110, in one implementation. In this implementation, the finger support structures and the sidewalls are disposed differently from the first embodiment. In the second embodiment, for example, a back sidewall is defined along the back side of the base plate structure 1134 and depending on the airlock side of the EFEM 102 to which the ring storage station is being coupled, a sidewall for defining the second window 152 may be disposed along the first lateral side or the second lateral side of the base plate structure. In the example illustrated in FIG. 3B, the ring storage station 108*b* is coupled to the EFEM 102 above the left airlock 110L. As a result, the sidewall for defining the second window 152 is disposed along the second lateral side. In an alternate example, when the ring storage station is coupled above the right airlock 110R, the sidewall for defining the second window 152 may be disposed along the first lateral side. The second window 152 is a service window through which the edge rings are loaded into/unloaded from the ring storage station 108*b*.

The finger support structures are defined in the ring storage station 108*b*. For the design of the ring storage station shown in FIG. 3B, the first finger support structure 160*a* is defined on the first sidewall disposed along the first lateral side. A first pair of finger support structures 160*b*, 160*c*, is defined on the back sidewall disposed along the back side of the base plate structure. The first pair of finger support structures 160*b*, 160*c* defined on the back sidewall may be used to define the extent to which the edge ring can be moved into the ring storage station. As a result, each of the support fingers on the first pair of finger support structures 160*b*, 160*c* may include bumpers to prevent damage to the surface of the edge ring, when the edge ring is moved against the first pair of finger support structures. Since the service window 152 is defined along the second lateral side, the second finger support structure 160*d* is defined at the intersection of the second lateral side and the front side of the base plate structure. Each of the finger support structures are oriented parallel to one another. In the implementation illustrated in FIG. 3B, the first through the third finger support structures 160*a*-160*c* are defined orthogonal to the respective sidewalls while the second finger support structure 160*d* is defined at an angle that is less than 90°. The second finger support structure 160*d* is a moveable structure and its position and the angle at which it is disposed within the ring storage station can be adjusted to ensure unhindered movement of the carrier plate and the edge rings 200 into and out of the ring storage station 108*b*. For example, the position of the support column at the first end of the second finger support structure can be adjusted so as to prevent the support column of the second finger support structure from interfering with the movement of the edge ring into or out of the ring storage station 108*b* via the EFEM port. The position of the second end of the second finger support structure can also be adjusted so as to prevent any hindrance when the edge rings are being loaded/unloaded from the ring storage station.

Figure 3C:
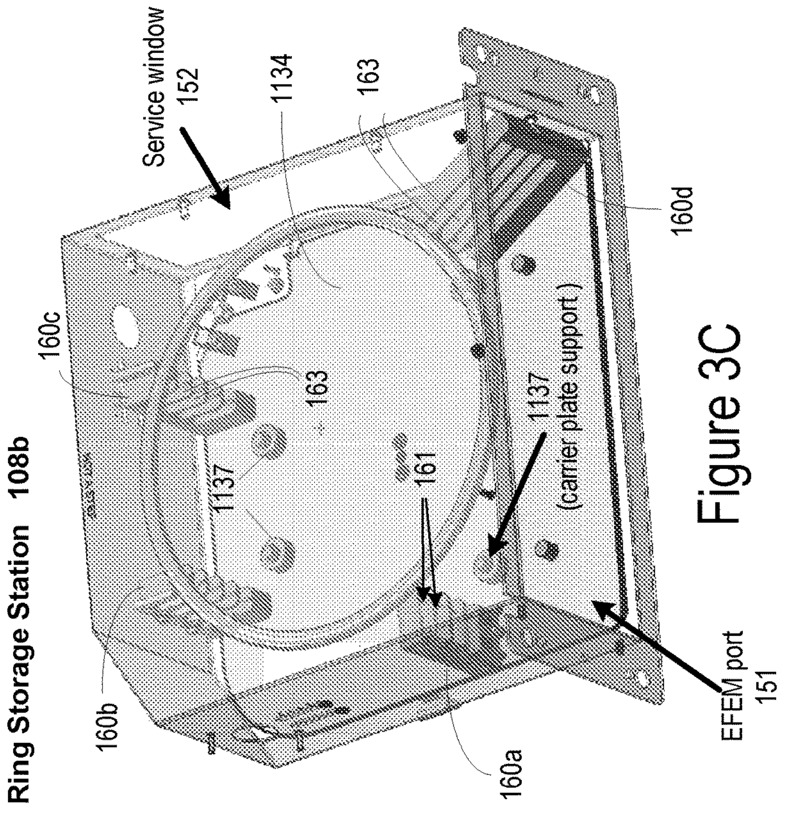
FIGS. 3C and 3D illustrate top perspective views of various components of the ring storage station that is coupled to the third side over the airlock, in some implementations.

FIG. 3C illustrates an overhead perspective view of the second embodiment of the ring storage station 108*b* shown in FIG. 3B in which the ring storage station is coupled to the third side of the EFEM 102 above the left airlock 110L. The overhead view shows the EFEM port 151 defined along the front side, the first finger support structure defined on the first lateral side, the first pair of finger support structures 160*b*, 160*c*, defined along the back side, and service window 152 defined along the second lateral side of the base plate structure.

Figure 3D:
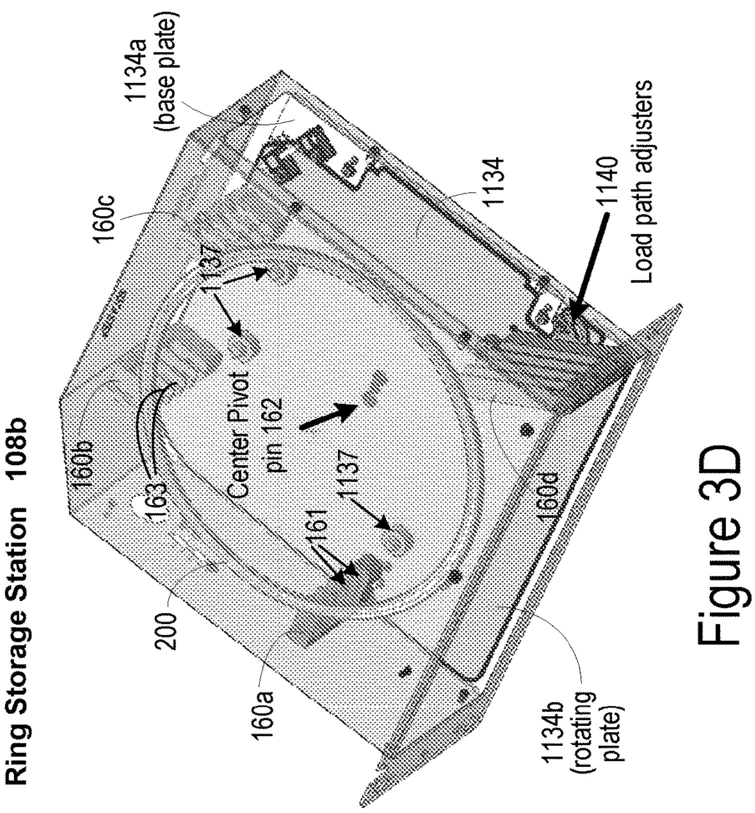

FIG. 3D illustrates an alternate perspective view of the second embodiment of the ring storage station 108*b*. The base plate structure 1134 of the second embodiment of the ring storage station includes a base plate 1134*a* that forms a base (i.e., bottom surface) of the base plate structure 1134, and a rotating plate 1134*b* that forms a top surface of the base plate structure 1134. Support pads are provided on a top surface of the base plate 1134*a* for receiving the rotating plate 1134*b* and the number and location of support pads are defined to provide kinematic support for the rotating plate 1134*b*. An outline of the rotating plate 1134*b* matches the outline of the base plate 1134*a*. A center pivot pin 162 extends from a center of the base plate 1134*a* through a center of the rotating plate 1134*b*. The center pivot pin 162 is used to rotate the rotating plate 1134*b* along a horizontal plane. A set of load path adjusters 1140 are defined on the rotating plate 1134*b* proximal to the support column of the second finger support structure 160*d* defined at the intersection of the second lateral side and the front side of the base plate structure. The load path adjusters 1140 are attached to the second finger support structure 160*d* and used to adjust position of the support column of the second finger support structure 160*d* within the ring storage station 108*b*. The positional adjustment is to ensure that the second finger support structure does not interfere with the movement of the edge ring into and out of the ring storage station 108*b* via the EFEM port 151.

Further, index pins 161 are disposed on each of the support fingers of the first and the second finger support structures 160*a*, 160*d*, and are used to engage with the corresponding grooves defined on the underside surface of the edge ring. The setting of the finger support structures are determined by calibrating the angular rotation of the edge ring retrieved from the process module and using the calibration for receiving and removing the edge ring from the ring storage station. When the edge rings are initially loaded into the ring storage station 108 (either 108*a* or 108*b*), care is taken to ensure that the grooves of the pin align with the index pins on the respective finger supports defined on the first and the fourth finger support structures 160*a*, 160*d*. Additional adjustments to the alignment may be performed at process module.

Figure 3E:
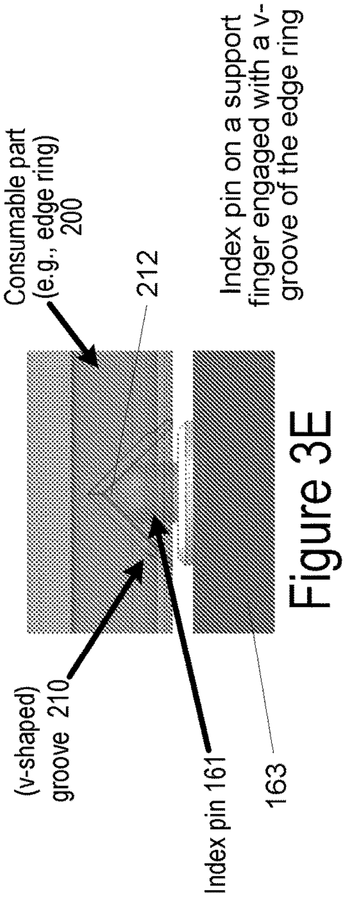
FIG. 3E illustrates an expanded view of a portion of a support finger with an index pin that is engaged with the groove defined on an underside surface of a consumable part received in the ring storage station, in one implementation.

FIG. 3E illustrates an expanded side view of a portion of a support finger of the fourth finger support structure with an index pin engaged with a first embodiment of a groove of the edge ring, in one implementation. The positional alignment of the edge ring to the index pins may be done during initial loading of the edge ring into the ring storage station. The first embodiment of the groove is a v-shaped groove defined on the bottom surface of the edge ring 200 and the edge ring aligns with the index pin 161 defined on a support finger 163 and engages with the groove at the pin contact position 212. Based on the positional settings of the finger support structures within the ring storage station, the alignment may result in the index pin 161 contacting a portion of an inclined sidewall of the groove and sliding into the pin contact position 212. In one implementation, the loading of the edge ring is carried out manually. In this implementation, a person loading the edge ring may use the index pin 161 as a guide. In an alternate implementation, the edge rings are loaded into the ring storage station in an automated manner wherein a robot may be trained to load the edge ring using the index pin as a guide.

Figure 3F:
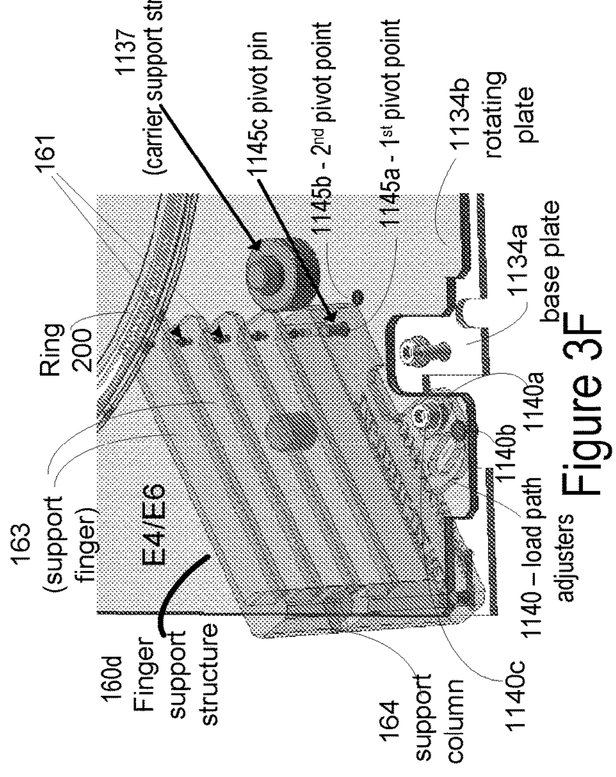
FIGS. 3F-3I illustrate expanded perspective views of finger support structure defined in the ring storage station, in one implementation.

FIGS. 3F-3I show an expanded view of a second finger support structure used in the second embodiment of the ring storage station that can be adjusted at both ends to allow the edge ring to be easily moved into and out of the ring storage station 108*b*, in some example implementations. As shown in FIG. 3F, load path adjusters 1140 are defined on the rotating plate 1134*b* proximal to the support column 164 of and connected to the second finger support structure 160*d* disposed on the rotating plate 1134*b*. The load path adjusters 1140 include an adjuster plate on which one or more open channels are defined. In the example load path adjusters 1140 shown in FIG. 3F, two open channels 1140*a*, 1140*b*, are defined parallel to one another. When the position of the support column of the second finger support structure is to be adjusted, one or more anchor pins 1140*c* are used within one or both the open channels 1140*a*, 1140*b* to secure the rotating plate 1134*b* at a first position or a second position on the base plate 1134*a*. In the example illustrated in FIG. 3F, one anchor pin 1140*c* is used in the open channel 1140*a* to secure the second finger support structure 160*d* to a first position on the base plate 1134*a*.

In addition to the load path adjusters 1140, one or more pivot points are defined on the rotating plate 1134*b*. The pivot points 1145*a*, 1145*b*, in some implementations, are defined to extend through the rotating plate 1134*b* and into the base plate 1134*a*. The pivot points 1145*a*, 1145*b* are defined proximal to the second end of the second finger support structure 160*d* and are used to move the second end of the second finger support structure 160*d*. A corresponding pivot anchor point may be defined in the bottom support finger of the second finger support structure 160*d* to anchor the second end of the second finger support structure 160*d* at one of the first pivot point 1145*a* or 1145*b*, using a pivot pin 1145*c* that extends from the bottom support finger through the corresponding pivot point 1145*a*, 1145*b*. The position of the first and the second pivot points 1145*a*, 1145*b*, are defined on the rotating plate 1134*b* so as to correspond with the design of the VTM 104. For example, for a first embodiment of the VTM 104 (with either 4 or 6 facets for coupling with process modules), the first pivot point 1145*a* may be used to anchor the second end of the second finger support structure 160*d*, and for a second embodiment of the VTM 104 (with 5 facets for coupling with process modules), the second pivot point may be used to anchor the second end of the second finger support structure 160*d* to the base plate structure 1134. The first and the second pivot points are defined to keep the second finger support structure out of the edge ring path. The length of the support fingers 163 in the second finger support structure 160*d* for the second embodiment of the ring storage station 108*b*, is longer than the length of the support fingers in the remaining finger support structures 160*a*-160*c*.

Figure 3G:
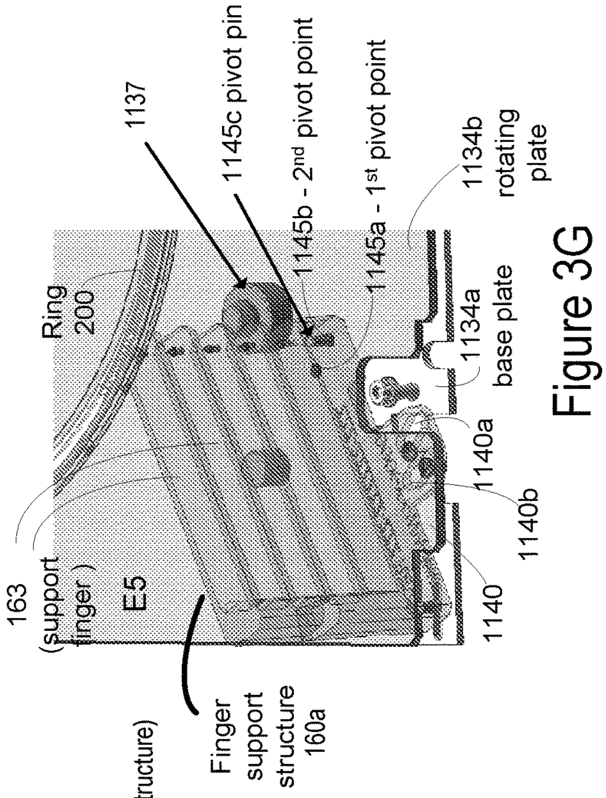
Figure 3H:
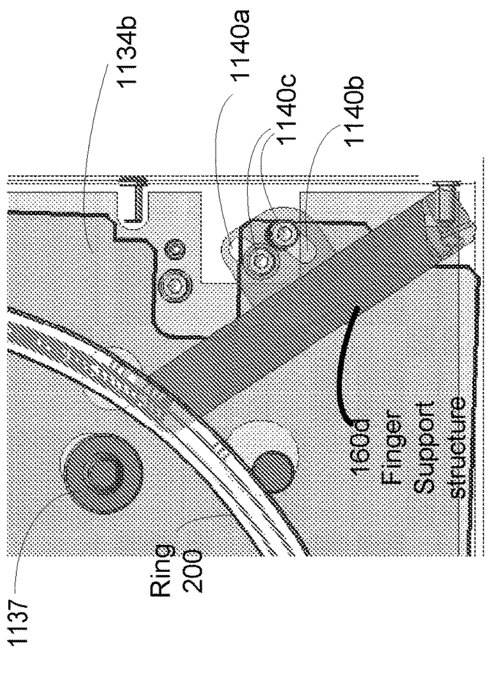
Figure 3I:
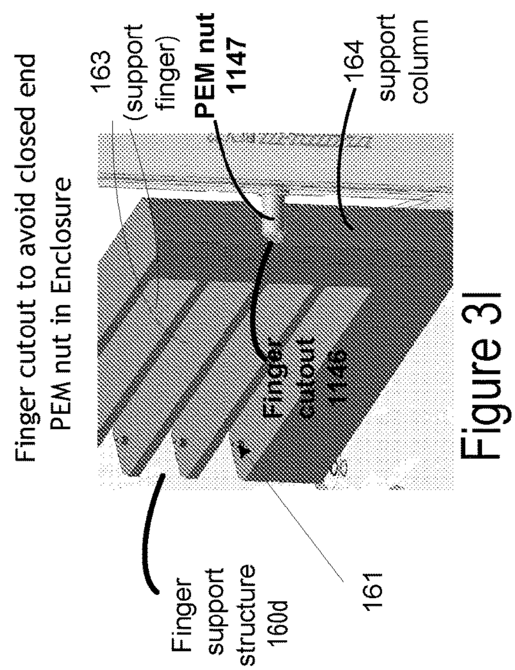

FIG. 3H illustrates a top view of the finger support structure 160*d* anchored to the base plate using the load path adjusters, in one implementation. As shown, the finger support structure 160*d* is anchored using two anchor pins 1140*c*, one anchor pin for each channel 1140*a*, 1140*b*. FIG. 3I shows an expanded view of the support column of the finger support structure 160*d*. The support column 164 includes a finger cutout 1146 defined thereon at a location where a nut, such as a PEM nut 1147, is defined within the ring storage station 108*b*. The cutout is provided to prevent the support column 164 from getting in the way of the PEM nut 1147 when the support column 164 is moved using the load path adjusters 1140.

Figure 4A:
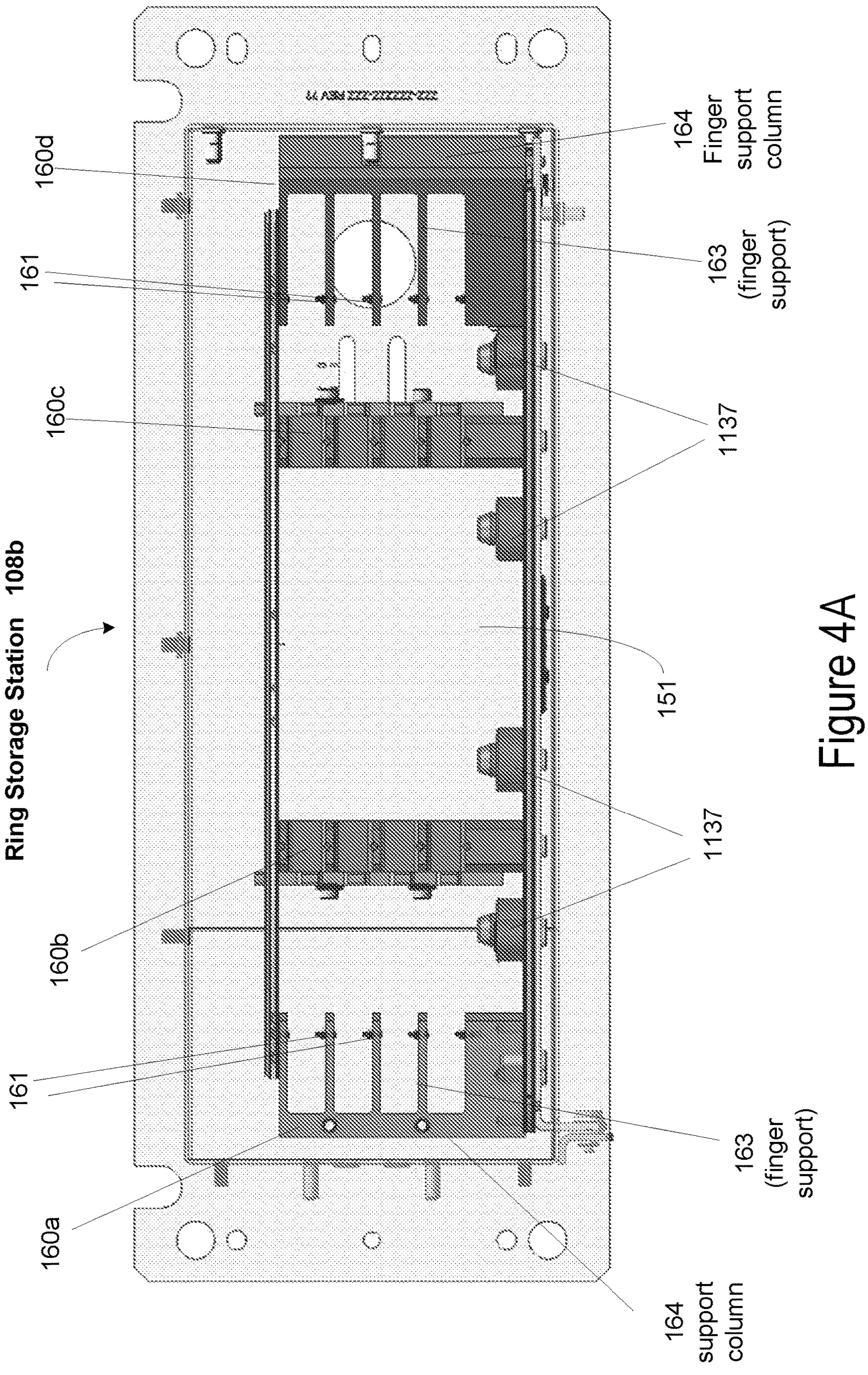
FIG. 4A illustrates a view of an inside section of the ring storage station as seen through a window that is configured to be coupled to a side of the EFEM, in one implementation.

FIG. 4A illustrates a view into the second embodiment of the ring storage station 108*b* as viewed through an EFEM port 151 of the ring storage station 108*b*. The view into the ring storage station 108*b* shows the first finger support structure 160*a* disposed on the first lateral sidewall, the first pair of finger support structures 160*b*, 160*c*, defined on the back sidewall of the ring storage station 108*b*, the second finger support structure 160*d* defined at a corner of the second lateral side and the front side of the ring support structure 108*b*. Each of the finger support structures include the corresponding support column 164 and a plurality of support fingers 163 attached to the support column 164. The view also shows the plurality of carrier plate supports 1137 disposed on the base plate structure, and the finger cutout 1146 on the support column 164 associated with the finger support structure 160*d.*

Figure 4B:
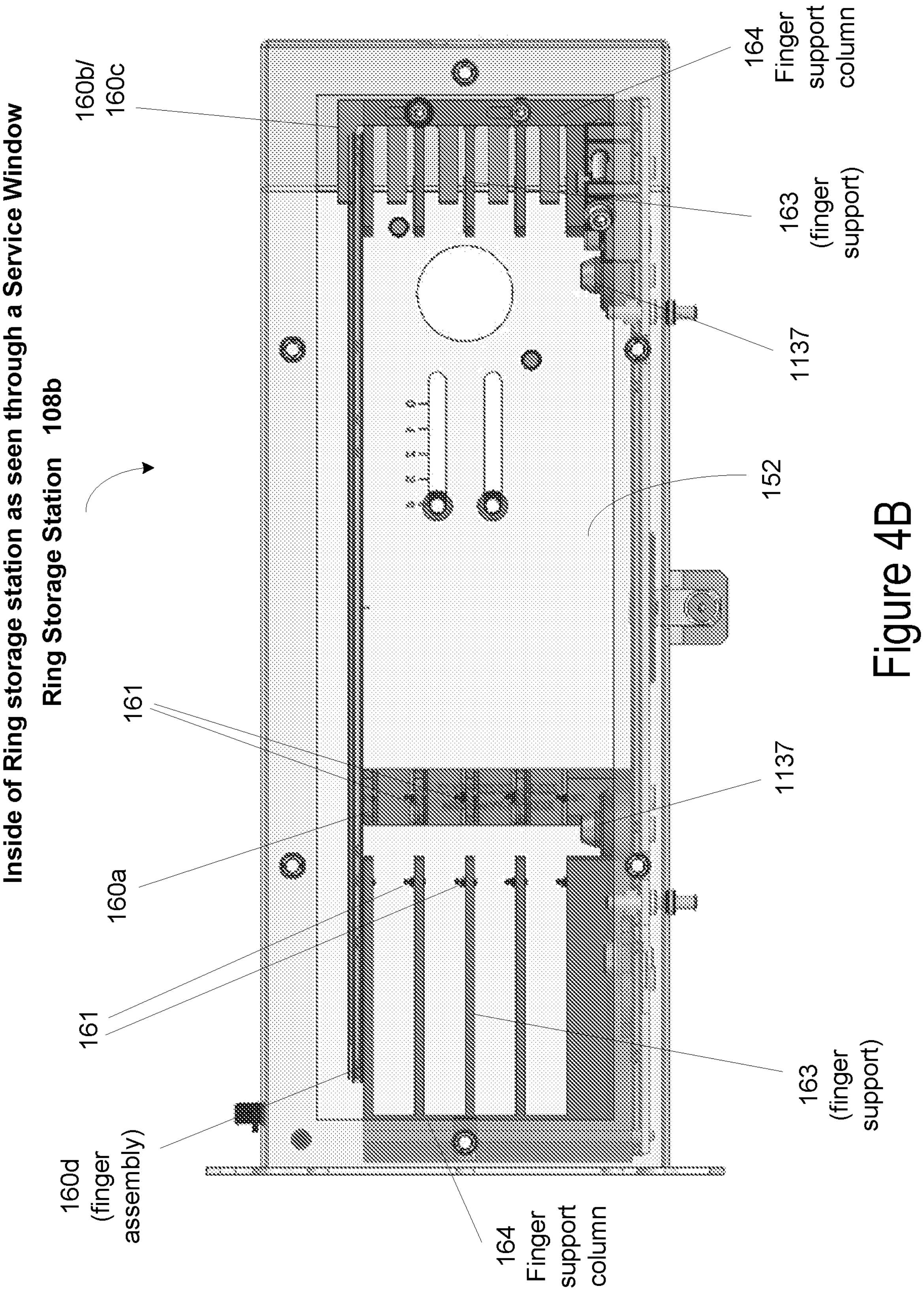
FIG. 4B illustrates a view of the inside section of the ring storage station as seen through a service window that is defined on a second side, in one implementation.

FIG. 4B illustrates a view into the second embodiment of the ring storage station 108*b* as viewed through the service window 152 of the ring storage station 108*b*. As in the previous view, the view through the service window 152 shows the second finger support structure 160*d* on the left side, the first finger support structure 160*a* on the first lateral sidewall facing the service window 152, and the first pair of finger support structures 160*b*, 160*c* on the right side. The carrier plate supports 1137 disposed on the base plate structure are also shown. The view shown in FIGS. 4A and 4B are for the second embodiment of the ring storage station 108*b* that is mounted on the side where the airlocks are mounted to the EFEM 102. The view into the first embodiment of the ring storage station 108*a* as viewed through the corresponding EFEM port 151 and the service window 152 will be different as the location of the service window and the finger support structures are different.

Figure 5A:
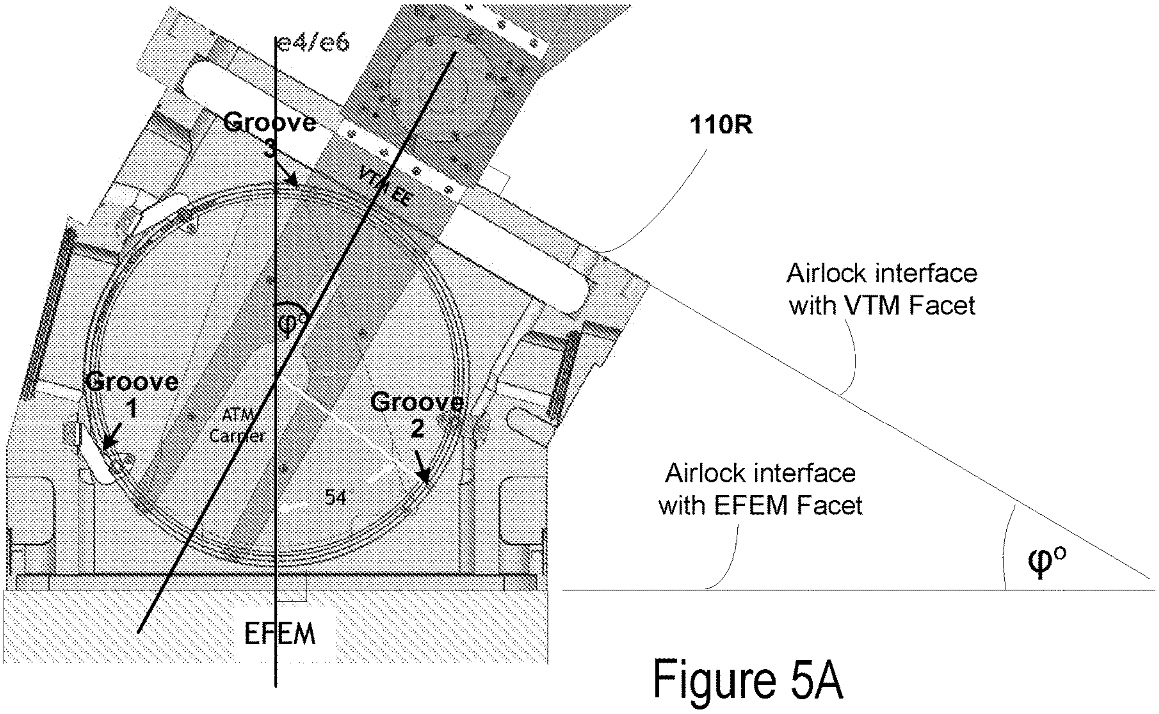
FIG. 5A illustrates a top view of an airlock into which an end-effector of a robot of a first embodiment of a vacuum transfer module delivers a used consumable part and a carrier plate used by a robot of the EFEM removes the used consumable part, in one implementation.

FIG. 5A illustrates the edge ring position received in an airlock, in one implementation. The calibration to determine the pre-alignment angle for the edge ring in the ring storage station begins by running one or more test runs of retrieving a test edge ring 200 from a process module and moving it to the ring storage station and determining the angle at which the edge ring is being deposited in the ring storage station. Once the pre-alignment angle is determined, the ring storage station can be setup so that the calibrated pre-alignment angle of the edge ring makes corresponding grooves of the edge ring to be within the capture range of the lift pins. As part of the test retrieval, a lift pin mechanism is activated within the process module to allow the lift pins to extend out of a lift pin housing and contact an underside surface of the edge ring. As the edge ring has been properly placed within the process module, the lift pins will be aligned with the grooves (e.g., v-shaped grooves) defined on the bottom side of the edge ring. The lift pins will therefore contact at the pin contact position 212 of the edge ring defined at the tip of the grooves and lift the edge ring from the installed position to a replacement position. Responsively, an end-effector disposed on the arm of the robot 105 of the VTM 104 will be extended into the process module to support the edge ring, at which time the lift pins are retracted into the housing. The end-effector is then retracted from the process module and the edge ring retrieved from the process module is transferred to an airlock used for such transfer, where it is stored on finger assembly defined therein. In the implementation shown in FIG. 5A, the right airlock 110R is being used to deposit the edge ring 200 retrieved from the process module by the end effector of the VTM's robot 105. Similar process can be followed if the left airlock 110L is being used to move the edge ring, in alternate implementation. In the alternate implementation, the ring storage station may either be positioned above the right airlock 110R or on the second side of the EFEM 102. After depositing the edge ring to the airlock, the end-effector is retracted into the VTM 104.

The end-effector of the robot 105 extends into the process module orthogonal to the facet of the process module that interfaces with the VTM 104. Thus, for each process module disposed at different facets of the VTM, the angle at which the end-effector enters and exits in relation to the facet of the process module interfacing with the corresponding facet of the VTM 104 is always 90°. Similarly, the angle at which the robot 105 of the VTM 104 extends into the airlock 110R is also orthogonal to the facet of the airlock 110R that interfaces with the corresponding facet of the VTM 104. The facets of the VTM are defined to provide symmetry to the VTM 104. Therefore, the angle of the facets of the VTM 104 differ based on the number of facets defined in the VTM, as each of the facets is defined to be equiangular and equilateral. Based on the design of the VTM 104 (e.g., number of facets in the VTM) used in the substrate processing system, the angle at which the retrieved edge ring 200 is deposited into the airlock 110R depends on the angle at which the facet of the airlock interfacing with the VTM is disposed in relation to the facet of the airlock 110R that interfaces with the EFEM.

After the VTM robot's end-effector is withdrawn from the airlock 110R, the robot 103 of the EFEM 102 is used to retrieve the carrier plate from the ring storage station 108 and used the carrier plate to retrieve the edge ring from the airlock 110R. As with the robot of the VTM, the robot of the ATM enters and leaves the airlock orthogonal to the facet of the airlock that interfaces with the facet of the EFEM 102. The retrieved edge ring 200 is moved to the ring storage station. The robot 103 enters the ring storage station 108 orthogonal to the facet of the ring storage station that interfaces with a corresponding facet of the EFEM 102, and positions the edge ring over the support fingers of a compartment within the part buffer of the ring storage station. Manual assessment of the alignment may be done during the test run to determine if the position of the edge ring needs any adjustment in order to engage with the index pins on the support fingers provided on the corresponding finger support structures (e.g., first and fourth support finger structures in the first embodiment of the ring storage station when the ring storage station is coupled on the second side of the EFEM, or a first and second support finger structures in the second embodiment of the ring storage station when the ring storage station is coupled to the third side of the EFEM over the left airlock 110L, in this example in which the right airlock 110R is being used to move the edge ring).

FIG. 5A illustrates a first embodiment of the VTM in which four or six facets are defined for interfacing with process modules in addition to two facets for interfacing with the airlocks (right and left airlocks 110R, 110L). The angle between the airlock interface with VTM facet and the airlock interface with EFEM facet in the first embodiment of the VTM 104 is shown as φ° in FIG. 5A, which would be the same angle that is between a direction of movement of the end-effector of the robot 105 delivering the edge ring into the airlock and the direction of movement of the end-effector of the robot 103 removing the edge ring from the airlock, wherein the edge ring is moved using a carrier plate. In some implementation, to ensure that the edge ring is received into the airlock, the robot may rotate the edge ring within the airlock.

Figure 5B:
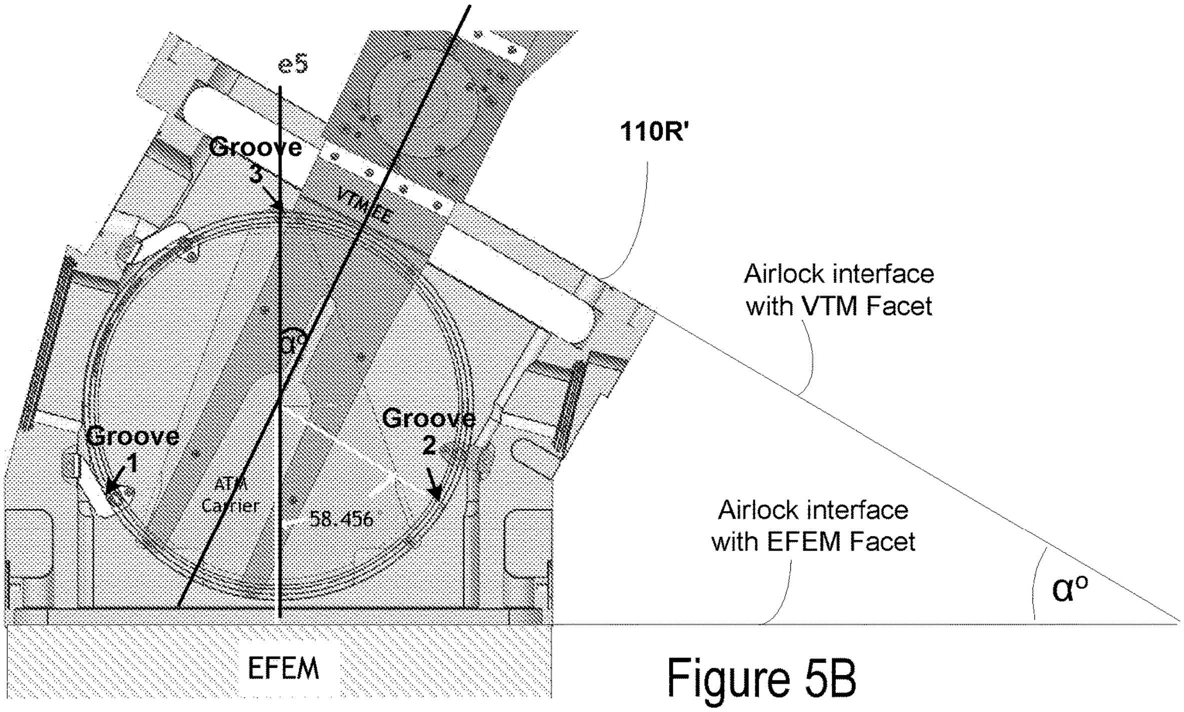
FIG. 5B illustrates a top view of the airlock into which the robot of a second embodiment of the vacuum transfer module delivers the used consumable part and the ring carrier used by the robot of the EFEM removes the used consumable part, in an alternate implementation.

FIG. 5B illustrates a second embodiment of the VTM 104 employed within the substrate processing system. The second embodiment of the VTM 104 may include 5 facets for interfacing with different process modules in addition to the two facets for interfacing with the airlocks (right and left airlocks 110R, 110L). In this second embodiment, the angle between the airlock interface with VTM facet and the airlock interface with EFEM facet is shown as α° in FIG. 5B, which would be the same angle between a direction of movement of the robot 105 delivering the edge ring into the airlock and the direction of movement of the robot 103 of the EFEM removing the edge ring with the carrier plate from the airlock. Further, the angle α° of the second embodiment of the VTM will be different from the angle φ° of the first embodiment of the VTM (i.e., α° not equal to φ°) due to the difference in the angle at which the facets of the first and the second embodiment of the VTM are defined.

Since the angle at which the edge ring is delivered to the airlock depends on the design of the VTM (e.g., number of facets), the location of the grooves of the edge ring as the edge ring is moved from the process module to the ring storage station change and this change can be attributed to the angle at which the edge ring is delivered to the airlock and the angle at which the edge ring is removed from the airlock. These angular changes are taken into consideration when setting up the ring storage station during pre-alignment. The ring storage station may be set up using the different pivot points, pivot pins and load path adjusters to accommodate for the different VTM designs.

Additionally, the base plate structure of the ring storage station can be used to provide additional rotational adjustments to the finger support structures so that the index pins defined on the support fingers on some of the finger support structures can align with or at least be within the capture range the v-grooves of the edge ring. The capture range is defined as an amount of offset that the v-grooves of the edge ring can be in relation to the lift pins, when the edge ring is received in the process module. In some implementation, the setting of the ring storage station for pre-aligning the edge ring within the ring storage station has resulted in delivering the edge ring to the process module within a capture range of between about +/−0.75° to about +/−0.90° from that of the lift pins. In alternate implementation, the pre-alignment setup of the ring storage station has resulted in the delivery of the edge ring to the process module within a capture range of about +/−0.82° from the lift pins.

The precision delivery can be attributed to the precise calibration done with the test runs. As the edge ring is being moved by the robots of the substrate processing system, the angle at which the edge ring is retrieved from the process module and the angle at which it is delivered to the ring storage station are very consistent. Additional test runs are done to confirm the consistency of the angle of the edge ring removed from the process module and delivered to the ring storage station. These additional test runs can be done between the same process module and the ring storage station or between other process modules and the ring storage station of the substrate processing system. The setup of the finger support structures in the ring storage station can be fine-tuned based on the results of the additional test runs. The adjustments made in the ring storage station after the test runs, are specific for the particular design of the VTM. As a result, these adjustments can be set and used for loading the edge rings into the ring storage station so that when the edge ring is delivered to the process module the grooves properly align with the lift pins or are within the capture range.

FIGS. 5A and 5B show the position of the grooves of the edge ring within the airlock 110R in accordance to the angle the edge ring was introduced into the airlock 110R. As shown, the edge ring includes three grooves (grooves 1-3) defined on the bottom side of the edge ring and the grooves are disposed equidistant from one another. The position of the grooves in the airlock 110R of FIG. 5A may be slightly different from that in FIG. 5B and this difference can be attributed to the angle at which the edge ring is introduced into the airlock 110R.

Figure 5C:
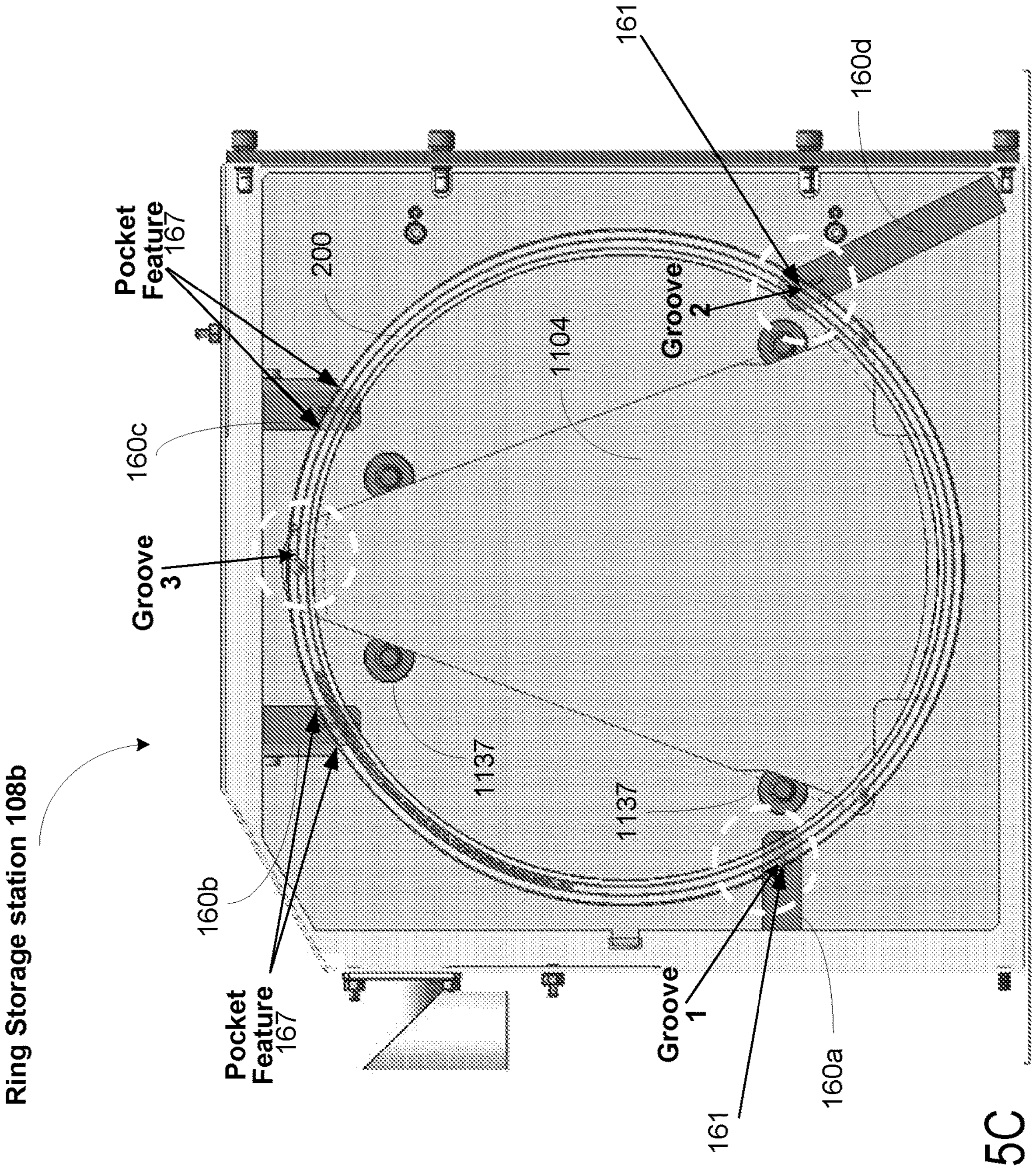
FIG. 5C illustrates a top view of the ring storage station showing the carrier plate delivering the consumable part to a compartment within the ring storage station, in one implementation.

FIG. 5C illustrates a top view of the ring storage station in which the carrier plate 1104 is received with the edge ring 200. The position of the grooves 1-3 are shown in relation to the index pins defined on the support fingers of the finger support structures 160*a* and 160*d*. In the test retrieval run that is carried out it may be determined that the grooves of the edge ring were slightly off from the index pins on the support fingers of the finger support structures. Additional test runs are done using the same process module or different process modules of the substrate processing system and each time the location of the grooves 1-3 in relation to the index pins are noted. The goal of these test runs is to determine the offset range of the grooves in relation to the index pins as this offset range relates to the position of the grooves of the edge ring relative to the lift pins of the process module(s). The offset range may be used to rotationally adjust the rotating plate 1134*b* so that the grooves of the edge ring can align with the index pins or come within the capture range.

In the implementation where a first embodiment of the VTM is being used, the setup of the ring storage station includes securing using the pivot pin 1145*c* to anchor the second end of the finger support structure 160*d* at the first pivot point 1145*a*, as shown in FIG. 3F. Similarly, in the implementation where a second embodiment of the VTM is being used, the second end of the finger support structure 160*d* is secured at the second pivot point 1145*b* using the pivot pin 1145*c*, as shown in FIG. 3G. Additionally, the support column of the finger support structure 160*d* is anchored at the first end using the support pin(s) 1140*c* so that the support column does not come in the way of the edge ring as it is being transferred into and out of the ring storage station. Once the finger support structure 160*d* has been anchored at both ends based on the embodiment of the VTM used in the substrate processing system, the rotating plate 1134*b* can be rotationally adjusted along the central pivot point in the horizontal plane, when the grooves of the edge ring do not align with the index pins defined on the support fingers.

In one embodiment, the above noted pins may be used to provide pre-alignment angle in the ring station. By way of example, one or more alignment pins 161 (i.e., finger with pins 161) maybe used to control alignment and ring rotation. With one or two pins, a pocket feature 167 may be used to prevent rotation about the pin and sliding of the pin along the radially aligned v-grove. In one embodiment, the pocket features 167 form a type of shaped edge stop. Thus, pocket features 167 are used to complete the ring horizontal position and rotation control, along with the pins 161 as shown in more detail in FIG. 5C. In another embodiment, a three pin configuration could be used, if clearance to the robotic and manual/human transfer is adequate. In a three pin 161 configuration, full kinematic alignment would be provided by the pins 161 by themselves.

An alternative method to form the ring support points is to use a single plate rather than the multiple support finger design described. Each slot in the ring stations could be made of a plate cut to a general "C" shape that wraps around the ring with clearance for the robotic ring transfer. Pins could be mounted to the plate with pocket features formed into the plate as needed. The current embodiment has the pin features for a ring/slot on different finger sub-assemblies. If the pre-alignment angle needed to be adjusted for each slot independently, mounting the two or three pins on a single plate would facilitate that independent adjustment. Each plate would be independently adjustable and the common rotating base plate could be removed.

Figures 6A, 6B, 6C, 6D, 6E, 6F:
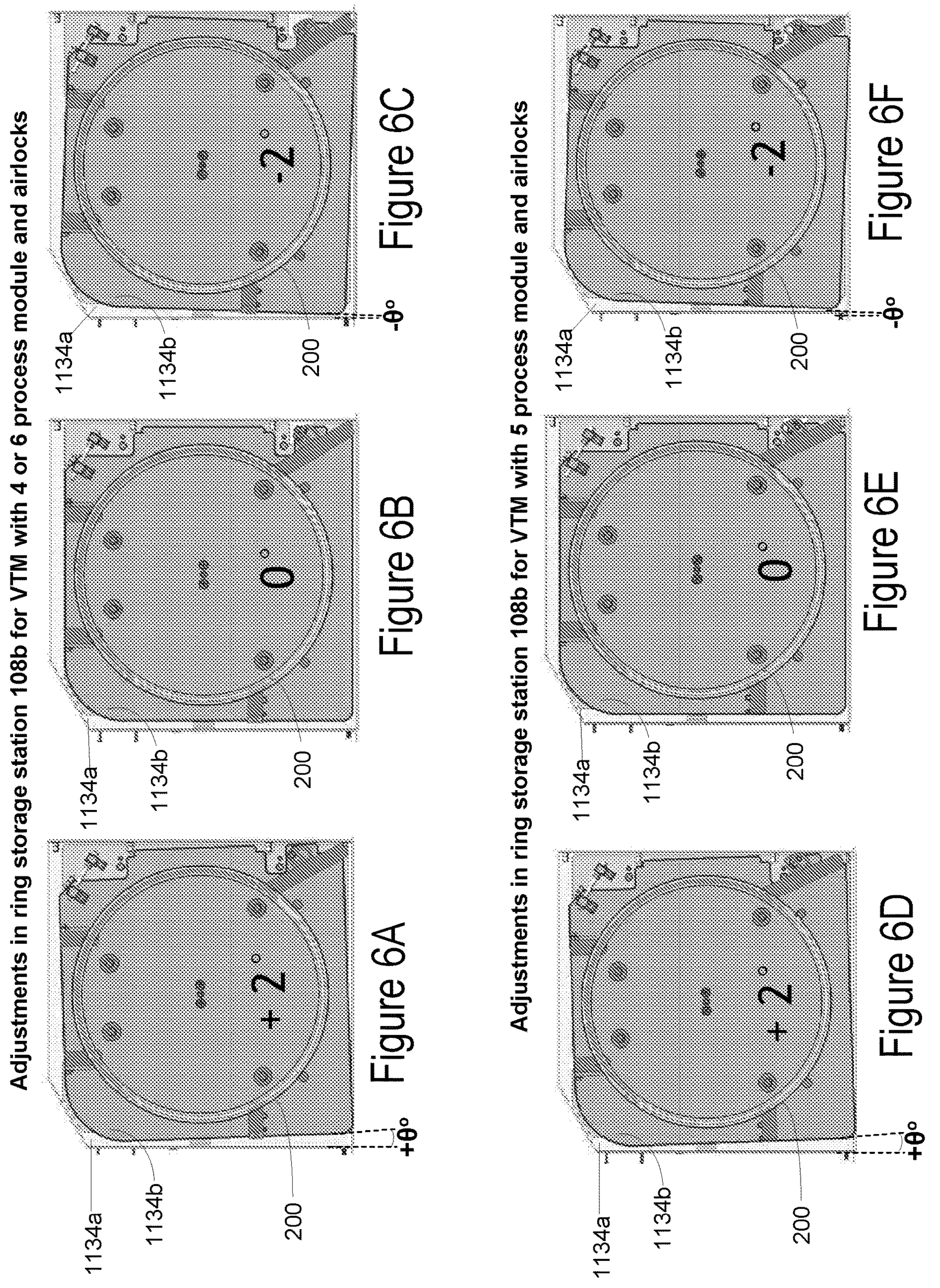
FIGS. 6A-6C illustrate an amount of adjustment of a rotating plate of a base plate structure within the ring storage station is to be carried out during a pre-aligning operation within the ring storage station used in the substrate processing system that includes the first embodiment of the vacuum transfer module, in some implementations.
FIGS. 6D-6F illustrate an amount of adjustment of the base plate that is to be carried out during a pre-aligning operation within the ring storage station used in the substrate processing system that includes the second embodiment of the vacuum transfer module, in some implementations.

FIGS. 6A-6C illustrate an extent to which the rotating plate may have to be rotated to adjust the alignment of the grooves to the index pins for the edge ring through the substrate processing system that employs the first embodiment of the VTM, in one implementation. Based on the amount of offset, the rotating plate may have to be moved + or −θ°. For instance, as shown in FIG. 6A, the rotating plate may have to be moved +θ°. In some implementations, the value of θ° may be between about 1° and about 5°. In alternate implementations, the rotating plate may be rotationally adjusted by about 2°. Alternately, as shown in FIG. 6B, the grooves may be offset from the index pins by an amount that would allow the index pins to contact the inclined sidewall of the groove (i.e., within the capture range) instead of the pin contact position 212 defined in the groove 210. In such cases, the rotating plate need not have to be adjusted further as the edge ring may align with the lift pins within the process module in a similar fashion. FIG. 6C illustrates an instance where the rotating plate may have to be moved −θ° (i.e., in a direction opposite to the direction shown in FIG. 6A) to align with the index pins. As mentioned with respect to FIG. 6A, the value of θ° may be between about 1° and about 5°, in some implementations. The rotating plate is received on a plurality of rest points distributed on the upper surface of the base plate. In one implementation, a set of 3 rest points are defined on the base plate to receive the rotating plate and are distributed to provide kinematic support and to allow the rotating plate to rotate about the center pivot point.

FIGS. 6D-6F illustrate similar adjustments that can be made to the rotating plate **1134*b* in order to properly align the index pins on the support fingers of the finger support structure in the ring storage station with the grooves of the edge ring retrieved from the process module, in an alternate implementation. The number of facets in the VTM used in this alternate implementation is different from the number of facets in the VTM used in FIGS. 6A-6C. Thus as shown in FIG. 6D, the rotating plate may be adjusted in a positive direction (i.e., anti-clockwise direction) by about θ°, wherein θ° may be between about 1° and about 5°, or no adjustments need to be made as shown in FIG. 6E, or adjusted in a negative direction (e.g., clockwise direction) by about θ°, as shown in FIG. 6F**. It should be noted that the adjustment that needs to be made to the rotating plate may be minimal as the robots move the edge ring reliably from the process module to the ring storage station.

Once the adjustments to the rotating plate have been defined, the adjustments are maintained during loading of the edge rings into the ring storage station. As mentioned earlier, the edge rings may be loaded into the ring storage station manually, and such manual loading is done by aligning the grooves to the index pins. This pre-alignment of the edge rings during the initial loading helps in correctly placing the edge ring in the process module. It should be noted that the pre-alignment of the edge ring is done by taking into account the specific side airlock that is being used to move the edge ring into the VTM 104 for delivery to the process module. It should also be noted that the pre-alignment of the edge ring may also take into account the type of airlock that is being used. Some of the types of airlock that can be used include side-by-side airlocks, stacked airlocks, or other airlock type that impacts the rotation alignment of the ring as it passes for EFEM to VTM or back. The specific type and side airlock used in the substrate processing system is taken into consideration when pre-aligning the edge ring to ensure that the angle at which the edge ring is delivered to the process module is consistent.

Figure 5D:
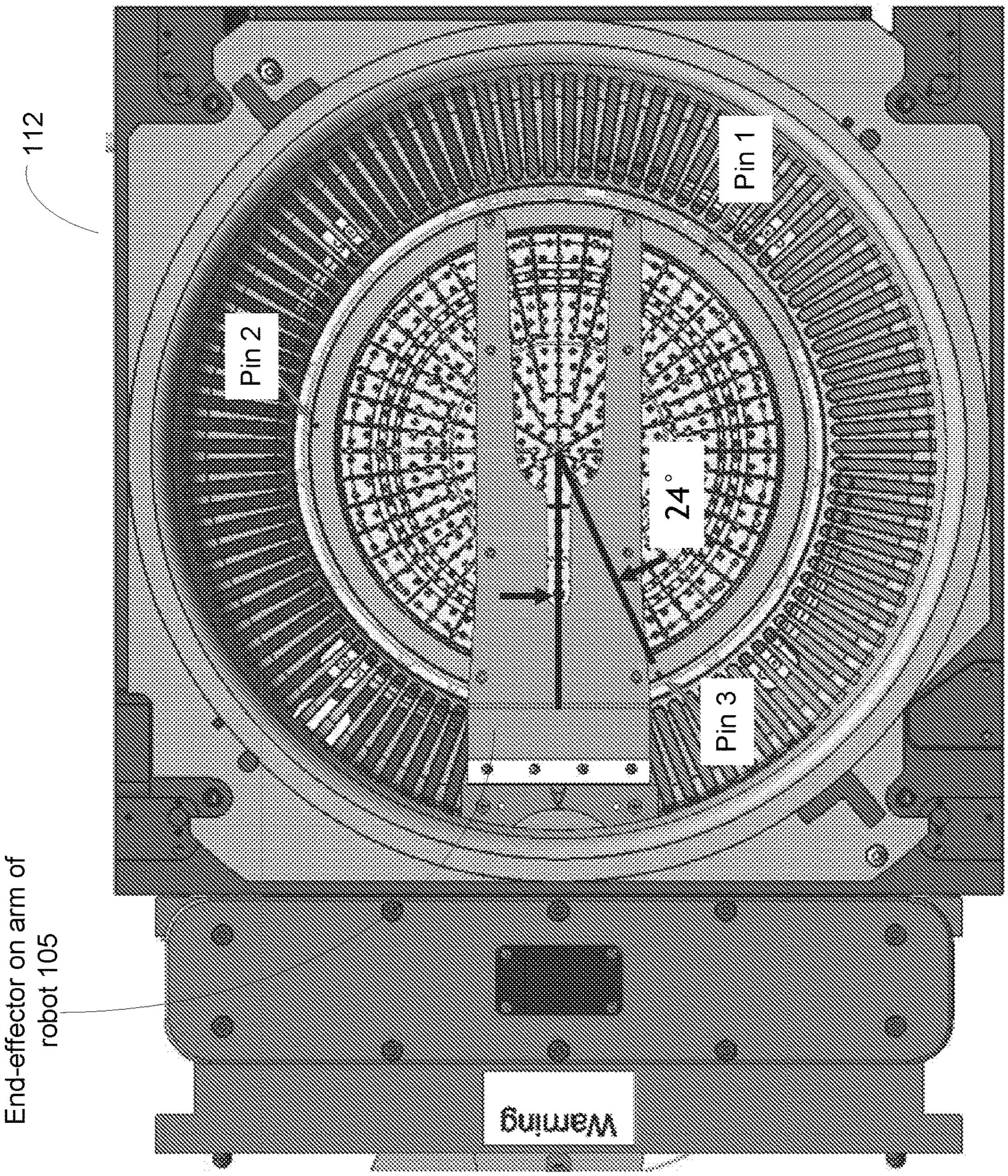
FIG. 5D illustrates a top view of a process module showing an end-effector of the robot of the vacuum transfer module used for delivering the consumable part, in one implementation.

FIG. 5D illustrates one such implementation where the end-effector of the robot of the VTM is used to place the edge ring into the process module such that the grooves 1-3 of the edge ring align with the lift pins 1-3 of the lift pin mechanism.

The various embodiments described herein allow the consumable parts to be replaced in a fast and efficient manner by using robots of an ATM 102 and VTM 104 that was used to transport a substrate to also transport a consumable part, such as the edge ring into and out of the process modules. The ring storage station design described in the various embodiments enables bypassing the dynamic aligner of the substrate processing system and instead use the components of the ring storage station to perform rotational alignment of the edge ring so that when the edge ring is delivered to the process module, the contact occurs between the v-shaped grooves of the edge ring and a top of the lift pin used in the process module. The pre-alignment done in the ring storage station allow the robots of the EFEM and the VTM to deliver the edge ring with sufficient accuracy such that the lift pins engage the edge ring or fall within a capture range defined by the dimensions of the v-grooves, so that the lift pins when engaging with the edge ring are able to contact the sidewalls of the v-grooves and slide into the pin contact position of the v-grooves. As the lift pins lift the edge ring off the end-effector, any X, Y coordinate position and/or minor adjustment to the rotational alignment are corrected by the lift pin. The final alignment of the edge ring about the electrostatic chuck or pedestal on which the edge ring is received, is controlled by the lift pins.

The ring storage station discussed in the various implementations/embodiments is similar in structure to a substrate storage station, such as a front open unified pod (FOUP), but is specifically designed for the edge rings and/or other consumable parts used in the process module that need replacing. The rotation alignment of the edge ring for delivery to the process module is controlled by pre-aligning the ring angle to a fiducial (e.g., index pins) in the ring storage station, wherein the index pins are used to align to the v-groove. In addition to pre-aligning the edge ring, the path the edge ring takes through the substrate processing system is limited to airlock on one side (e.g., right airlock in the embodiments illustrated in FIGS. 5A, 5B) so as to limit angular changes. The angular changes can occur when the edge ring is allowed to go through the different airlocks (i.e., right airlock versus left airlock), due to the angle at which the right side airlock is disposed versus the left side airlock. To avoid variation in the angle of delivery and to keep the edge ring angle consistent, the path of the edge ring is restricted to airlock on one side. Deciding which side airlock to use for moving the edge ring may be based on which side provides the rotational angle advantage.

The pre-alignment adjustments made in the ring storage station account for system tolerances, such as hardware assembly tolerances, repeatability of EFEM and VTM robots during delivery and retrieval of the edge rings, calibration of coordinates during placement or removal from the ring storage station, dynamic alignment corrections to center the edge ring, minor shifting that occurs during hand-offs due to leveling and other factors, ring angle pre-alignment tolerance, to name a few. The tolerances affecting the edge ring rotation between the ring storage station and the process module are determined by running multiple test runs of retrieving the edge ring from the process module and delivering to the ring storage station. Based on the results from the test runs, the tolerances are addressed by calibrating the index pins in the ring storage station. The calibration of the index pins is done by rotating the rotating plate about the center pivot pin, so that the finger support structures attached to the rotating plate rotate about the horizontal axis and the rotating plate is pivoted between about +/−1° to about +/−5°. In some implementation, the initial test run may be used to identify an initial alignment angle of the edge ring and the additional test runs may be used to identify the angular tolerances (i.e., variations after each test run from the same process module or variations between process module to process module) so that a mean offset angle can be determined and used to fine-tune the initial alignment angle.

In some implementations, each slot in the ring storage station used for storing the edge ring can be individually calibrated and the edge ring in the slot may be used for assigning to a specific process module. In alternate implementations, the calibration of the index pins is common to all slots, wherein the edge ring from any slot can be delivered to any process module within the substrate processing system.

The service window defined on one side of the ring storage station is used to load and unload the edge rings. A shutter or door defined for the service window provides access to the ring storage station. A shutter or door defined between the ring storage station and the EFEM allows the ring storage station to be isolated from the rest of the substrate process system. The operation of these shutters are done in a coordinated manner so as to allow the loading of the edge rings into the ring storage station and the processing of the substrates in the substrate processing system to continue.

In the instance the edge rings are loaded to the ring storage station manually, any error in the alignment of the edge ring to the index pins can be detected with the use of a mapping sensor. For example, a mapping sensor disposed on the end-effector of the robot 103 of the EFEM 102 used to detect presence or absence of the edge rings within the ring storage station can also be used to detect a ring tilt that can occur when the edge ring is not aligned with the index pin during loading. The same mapping sensor can also be used to detect any misalignment of the edge ring that was delivered from the process module. In some implementation, if the tilt in the ring does not encroach on required transfer clearance for the edge rings in the slot or compartment above or below, the tilt in the used edge ring returned from the process module may be used to trigger a warning via software of the computer. The trigger warning may be identified as a non-fatal error, allowing the system to continue processing the substrate, in some implementation. In some implementation, the mapping sensor may use laser technology for detecting presence or absence of the edge ring in a particular slot and whether the edge ring in the slot is positioned correctly or is misaligned in the particular slot/compartment. In one configuration, the EFEM robot mapping sensor may be used to detect when a ring is not correctly placed, e.g., horizontally level, in a slot or the buffer slot. By way of example, this error detection ability is a combination of the pin to anti-walk grove engagement and the height measurement capability of the mapping sensor.

In some implementations, the end effector mechanism used by the robots of the EFEM and the VTM are designed such that it is able to support not only the substrate but also the edge ring. In some implementations, the end effector of the robot in the EFEM is configured to support a carrier plate and the edge ring that is received on the carrier plate, while the end-effector of the VTM robot is extended to accommodate both the substrate and the consumable part, such as the edge ring. The finger assemblies within the airlock are designed to support the consumable part as well as the substrate. In some implementations, the end effector mechanism of the VTM robot and the finger assembly of the airlocks include a plurality of contact pads to provide mutually exclusive contact points for the substrates and the edge rings, to avoid cross contamination. The contact pads for the substrates and the edge ring (consumable contact pads, substrate contact pads) may be designed so as to provide contact points at different heights or radial distances to accomplish exclusive separation within expected substrate or consumable part position error. To accommodate the increase in payload and reduce deflection, the end effector mechanism of the robot in the EFEM may be made of higher stiffness materials, such as ceramics, to limit increase in deflection or thickness, while reducing total payload on the robot using the re-designed end effector mechanism.

In an alternative embodiment, the ring rotational alignment features described herein can be integrated into a wafer FOUP-like removable box or “Front Opening Ring Pod (FORP).” A FORP is modified to hold edge rings, instead of wafers, as is done in standard FOUPs. Thus, integrating one or more of the rotational alignment features into FORPs can assist in efficient loading and unloading of edge rings (i.e., consumable parts) from FORPs into a tool and back, with the desired alignment. In some cases, depending on where the FORP is loaded into the tool (i.e., load location), the angle of alignment may need to be modified to account for the angle at which the robot will access the FORP. In one embodiment, the FORP can be interfaced with the tool via standard or modified load ports. Load ports can interface with an EFEM. In some cases, FORPs may be interfaced with a process tool itself, either directly or via an interface.

The various embodiments described herein provide an efficient, cost-effective way of replacing the consumable part within a substrate processing system without breaking the vacuum seal, thereby allowing the substrate processing system to have a shorter downtime. Reduced downtime of the substrate processing system would result in improved wafer throughput.

Figure 7:
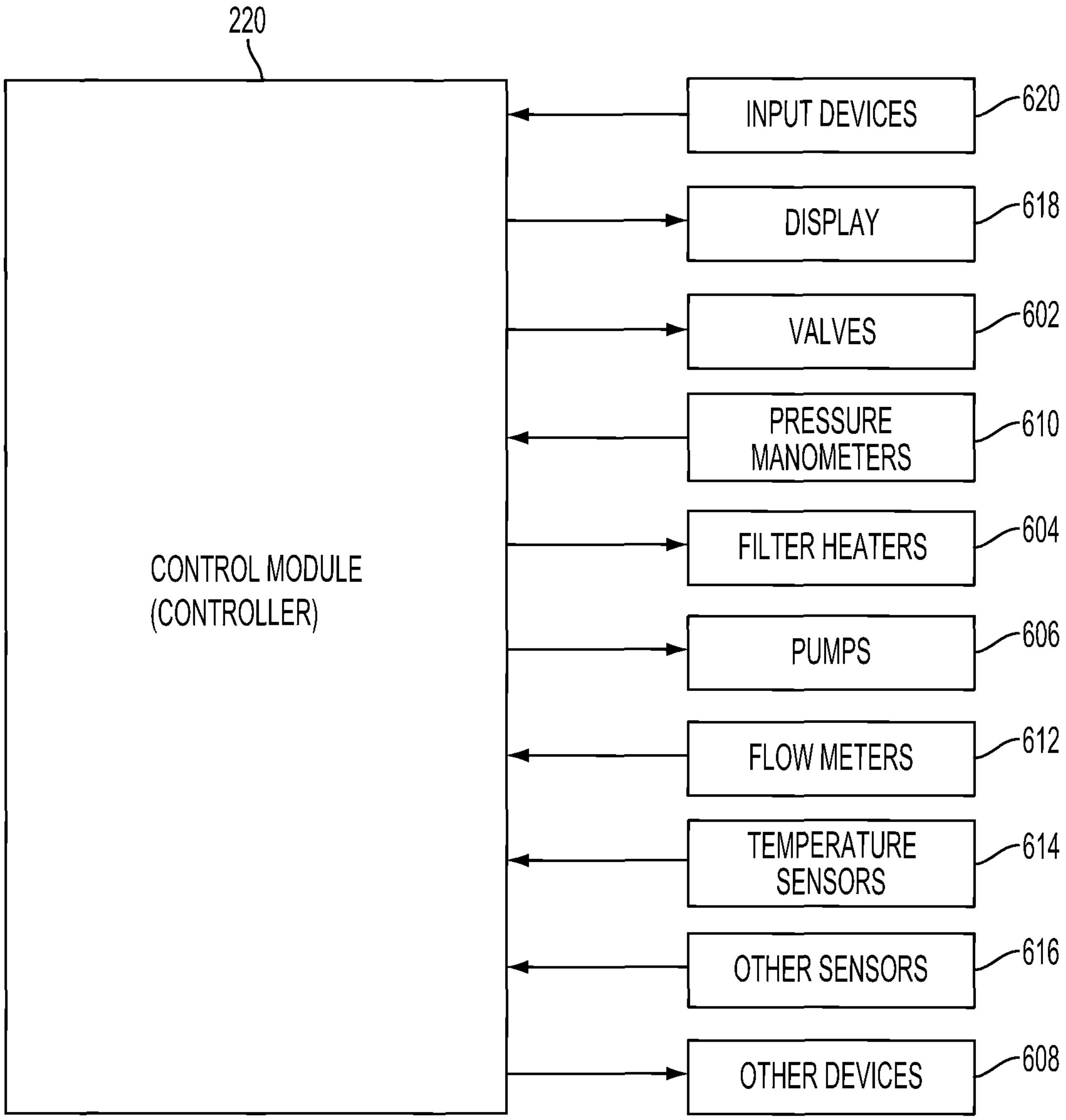
FIG. 7 illustrates a control module (i.e., a controller) for controlling various aspects of substrate processing system, in accordance with one implementation.

FIG. 7 shows a control module (also referred to as a “controller”) 220 for controlling the substrate processing system described above. In one embodiment, the controller 220 may include some example components, such as a processor, memory and one or more interfaces. The controller 220 may be employed to control devices in a substrate processing system 100 based in part on sensed values. For example only, the controller 220 may control one or more of valves 602 (including isolation valves 216, 216' of FIGS. 5A, 5B, 5C), filter heaters 604, pumps 606 (including pump 233), and other devices 608 based on the sensed values and other control parameters. The controller 220 receives the sensed values from, for example only, pressure manometers 610, flow meters 612, temperature sensors 614, and/or other sensors 616. The controller 220 may also be employed to control process conditions during precursor delivery and deposition of a film. The controller 220 will typically include one or more memory devices and one or more processors.

The controller 220 may control activities of the precursor delivery system and deposition apparatus. The controller 220 executes computer programs including sets of instructions for controlling process timing, delivery system temperature, pressure differentials across the filters, valve positions, robots and end effectors, mixture of gases, chamber pressure, chamber temperature, wafer temperature, RF power levels, wafer chuck or pedestal position, and other parameters of a particular process. The controller 220 may also monitor the pressure differential and automatically switch vapor precursor delivery from one or more paths to one or more other paths. Other computer programs stored on memory devices associated with the controller 220 may be employed in some embodiments.

Typically, there will be a user interface associated with the controller 220. The user interface may include a display 618 (e.g. a display screen and/or graphical software displays of the apparatus and/or process conditions), and user input devices 620 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module (i.e., controller) parameters relate to process conditions such as, for example, filter pressure differentials, process gas composition and flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber or process module components necessary to carry out the inventive deposition processes. Examples of programs or sections of programs for this purpose include substrate positioning code, process gas control code, pressure control code, heater control code, plasma control code, lift mechanism control code, robot position code, end effector position code and valve position control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the wafer chuck. The valve position control code may include code to control access to a process module or the substrate processing system by controlling isolation valves that provide access to the process module or the cluster tool, for example. The lift mechanism control code may include code to activate the actuator drive to cause the actuators to move the lift pins, for example. The robot position code may include code to manipulate the position of the robot(s) including manipulation of the robot to move along a lateral, a vertical, or a radial axis, for example. The end effector position code may include code to manipulate the position of the end effector including manipulation of the robot to extend, contract, or move along a lateral, a vertical or radial axis, for example.

Examples of sensors that may be monitored during deposition include, but are not limited to, mass flow control modules, pressure sensors such as the pressure manometers 610, and thermocouples located in delivery system, the pedestal or chuck (e.g. the temperature sensors 614). Appropriately programmed feedback and control algorithms may be used with data from these sensors to maintain desired process conditions. The foregoing describes implementation of embodiments of the invention in a single or multi-chamber semiconductor processing tool.

In one implementation, a ring storage station for delivering a consumable part to a substrate processing system is disclosed. The ring storage station includes a base plate structure defined at a base of the ring storage station. An end-effector access opening is defined along a front side of the base plate structure. A first sidewall is disposed along a first lateral side of the base plate structure. A back sidewall is disposed along the back side of the base plate structure. A service window opening is defined on a second lateral side of the base plate structure. A plurality of finger support structures are mounted on the base plate structure. Each finger support structure includes a support column and support fingers defined thereon, such that a first end of the support fingers are attached to the support column and a second end extends toward a center of the ring storage station. The plurality of finger support structure includes a first finger support structure disposed on the first lateral side of the base plate structure, a first pair of finger support structures are disposed along the back side, and a second finger support structure is disposed at an intersection of the second lateral side and the front side. The support fingers in the first and the second finger support structure include index pins defined proximal to the second end. The index pins are used to align with the consumable parts received within the ring storage station.

In some implementations, the base plate structure includes a base plate defining a bottom side of the base plate structure and a rotating plate disposed on a top surface of the base plate to define a top side of the base plate structure. A center pivot pin extends from a center of the base plate through a center of the rotating plate, the rotating plate configured to rotate about the center pivot pin along a horizontal axis during positional calibration.

In some implementations, the plurality of finger support structures is defined on the rotating plate.

In some implementations, the second finger support structure is an adjustable finger support structure. Load path adjusters are defined on the rotating plate proximal to the support column of the adjustable finger support structure and are configured to adjust a position of the support column of the adjustable finger support structure.

In some implementations, the load path adjusters include an adjuster plate having one or more open channels, and one or more adjuster pins to secure the support column of the adjustable finger support structure to the base plate using the one or more open channels at a position that allows the consumable part to move into and out of the ring storage station unhindered.

Still further, in some embodiments, consumable parts may have one or more laser engraving markers inside or in the material to assist in position detection during transfer of consumable parts between ring storage and process module.

The various embodiments described herein allow the consumable parts to be replaced in a fast and efficient manner without having to open the substrate processing system to atmospheric conditions. As a result, the time to replace consumable parts, as well as any risk of contaminating the chamber during replacement of consumable parts is greatly reduced, thereby allowing the substrate processing system to come online faster. Further, risk of inadvertent damage to the process module, the consumable part and to other hardware components in the process module are greatly reduced.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

The invention claimed is:

1. A ring storage station for delivering consumable parts used in a substrate processing system, comprising:
- a housing including,
  - a base plate;
  - a rotating plate disposed over the base plate and configured to rotate along a horizontal plane about a central pivot pin disposed at a center of the base plate and extending through a center of the rotating plate;
  - an end-effector access opening disposed at a first side of the housing;
  - a service window opening disposed on a second side of the housing;
  - a set of finger support structures that include support fingers disposed on corresponding support columns, the set of finger support structures being connected to the rotating plate within the housing.

2. The ring storage station of claim 1, wherein at least two of the finger support structures have finger supports with index pins, the index pins are configured to radially align the consumable parts when disposed in the ring storage station.

3. The ring storage station of claim 1, wherein the second side that includes the service window opening is disposed adjacent to the first side that includes the end-effector access opening.

4. The ring storage station of claim 3, wherein one of the finger support structures is an adjustable finger support structure, the adjustable finger support structure defined at an intersection of the first side and the second side.

5. The ring storage station of claim 4, wherein the rotating plate includes load path adjusters defined thereon, the load path adjusters are defined proximal to the support column of the adjustable finger support structure and configured to adjust a position of the support column of the adjustable finger support structure.

6. The ring storage station of claim 5, wherein the load path adjusters includes an adjuster plate having one or more open channels and one or more adjuster pins to engage the rotating plate to the base plate via the one or more open channels when securing the support column of the adjustable finger support structure at a position that allows the consumable part to move into and out of the ring storage station unhindered.

7. The ring storage station of claim 4, wherein the rotating plate includes a first pivot point and a second pivot point defined proximal to a second end of the adjustable finger support structure, the first pivot point and the second pivot point are used to secure the second end of the adjustable finger support structure at a first position or a second position,
- wherein securing of the adjustable finger support structure to the first position or the second position is based on a design of modules within the substrate processing system.

8. The ring storage station of claim 1, wherein the second side that includes the service window opening is disposed opposite to the first side that includes the end-effector access opening.

9. The ring storage station of claim 8, wherein the set of finger support structures includes,
- a first pair of finger support structures disposed on a first lateral side of the ring storage station, such that a first finger support structure of the first pair is disposed proximal to the first side and a second finger support structure of the first pair is disposed proximal to the second side; and
- a second pair of finger support structures are disposed on a second lateral side of the ring storage station, such that a third finger support structure of the second pair is disposed proximal to the first side and a fourth finger support structure of the second pair is disposed proximal to the second side.

10. The ring storage station of claim 1, wherein the end-effector access opening and the service window opening includes a shutter that is operable in a coordinated manner to isolate the ring storage station or the substrate processing system.

11. The ring storage station of claim 1, wherein the rotating plate includes a carrier plate housing defined thereon, the carrier plate housing configured for storing a carrier plate used in moving the consumable part to and from the ring storage station.

12. The ring storage station of claim 1, wherein the consumable part is an edge ring used in a process module within the substrate processing system.

13. A ring storage station for delivering a consumable part to a substrate processing system, comprising:
- a base plate;
- a first opening disposed on a first side of the ring storage station;
- a second opening disposed on a second side of the ring storage station; and
- a set of finger support structures defined on the base plate, each of the finger support structures includes a support column and support fingers extending from the support column to a center of the ring storage station, wherein at least two of the finger support structures have support fingers with index pins, the index pins are configured to engage with grooves defined on a bottom surface of the consumable parts to radially align the consumable parts when received in the ring storage station for storage.

14. The ring storage station of claim 13, further comprising, a carrier plate housing defined on the base plate, the carrier plate housing configured to house a carrier plate used in moving the consumable part to and from the ring storage station.

15. The ring storage station of claim 13, wherein the second side that includes a service window opening is disposed adjacent to the first side that includes an end-effector access opening.

16. The ring storage station of claim 15, wherein one of the finger support structures is an adjustable finger support structure, the adjustable finger support structure defined at an intersection of the first side and the second side.

17. The ring storage station of claim 16, wherein the base plate includes load path adjusters defined thereon, the load path adjusters are defined proximal to the support column of the adjustable finger support structure and configured to adjust a position of the support column of the adjustable finger support structure.

18. The ring storage station of claim 17, wherein the load path adjusters includes an adjuster plate having one or more open channels and one or more adjuster pins to engage a rotating plate to the base plate via the one or more open channels when securing the support column of the adjustable finger support structure at a position that allows the consumable part to move into and out of the ring storage station unhindered.

19. The ring storage station of claim 16, wherein the base plate includes a first pivot point and a second pivot point defined proximal to a second end of the adjustable finger support structure, the first pivot point and the second pivot point are used to secure the second end of the adjustable finger support structure at a first position or a second position, wherein securing of the adjustable finger support structure to the first position or the second position is based on a design of modules within the substrate processing system.

20. The ring storage station of claim 13, wherein the second side that includes the service window opening is disposed opposite to the first side that includes the end-effector access opening.

21. The ring storage station of claim 20, wherein the set of finger support structures includes, a first pair of finger support structures disposed on a first lateral side of the ring storage station, such that a first finger support structure of the first pair is disposed proximal to the first side and a second finger support structure of the first pair is disposed proximal to the second side; and a second pair of finger support structures are disposed on a second lateral side of the ring storage station, such that a third finger support structure of the second pair is disposed proximal to the first side and a fourth finger support structure of the second pair is disposed proximal to the second side.

22. The ring storage station of claim 13, wherein the consumable part includes three grooves uniformly disposed on the bottom surface of the consumable part so that at least two of the grooves aligns over and engages with the index pins on the at least two of the finger support structures.

23. A ring storage station for delivering consumable parts used in a substrate processing system, comprising:

a housing including, a base plate;

an end-effector access opening disposed at a first side of the housing;

a service window opening disposed on a second side of the housing;

a set of finger support structures that include support fingers disposed on corresponding support columns, the set of finger support structures being connected to the base plate within the housing, wherein at least one of the finger support structures is an adjustable finger support structure, the adjustable finger support structure configured to adjust a position of the corresponding support column on which support fingers are disposed.

24. The ring storage station of claim 23, wherein the second side that includes the service window opening is disposed adjacent to the first side that includes the end-effector access opening.

25. The ring storage station of claim 23, wherein the base plate includes load path adjusters defined thereon, the load path adjusters defined proximal to the support column of the adjustable finger support structure and used to adjust the position of the support column of the adjustable finger support structure.

26. The ring storage station of claim 23, wherein the base plate includes a first pivot point and a second pivot point defined proximal to a second end of the adjustable finger support structure, wherein the second end is opposite to an end where the support column is defined, the first pivot point and the second pivot point are used to secure the second end of the adjustable finger support structure at a first position or a second position, wherein securing of the adjustable finger support structure to the first position or the second position is based on a design of modules within the substrate processing system.

27. The ring storage station of claim 23, wherein at least two of the set of finger support structures have finger supports with index pins, the index pins are configured to radially align the consumable parts when disposed in the ring storage station.

28. The ring storage station of claim 23, wherein the ring storage station is interfaced with an equipment front end module (EFEM), and wherein the EFEM has a robot end effector with a mapping sensor, the mapping sensor is used to detect when a substrate is not correctly placed in a slot associated with the set of finger support structures.

* * * * *